United States Patent
Hansen et al.

(10) Patent No.: US 10,318,158 B2
(45) Date of Patent: *Jun. 11, 2019

(54) SYSTEM AND METHOD FOR DIGITAL SIGNALING AND DIGITAL STORAGE

(71) Applicant: BRILLIANT POINTS, INC., Reno, NV (US)

(72) Inventors: Karl Christopher Hansen, Reno, NV (US); Christopher Glenn Hansen, Amherst, NH (US)

(73) Assignee: BRILLIANT POINTS, INC., Reno, NV (US)

( * ) Notice: Subject to any disclaimer, the term of this patent is extended or adjusted under 35 U.S.C. 154(b) by 178 days.

This patent is subject to a terminal disclaimer.

(21) Appl. No.: 14/653,195

(22) PCT Filed: Dec. 18, 2013

(86) PCT No.: PCT/US2013/076231
§ 371 (c)(1),
(2) Date: Jun. 17, 2015

(87) PCT Pub. No.: WO2014/100235
PCT Pub. Date: Jun. 26, 2014

(65) Prior Publication Data
US 2015/0331611 A1 Nov. 19, 2015

Related U.S. Application Data

(60) Provisional application No. 61/738,650, filed on Dec. 18, 2012.

(51) Int. Cl.
*G06F 3/06* (2006.01)
*G06F 12/00* (2006.01)
(Continued)

(52) U.S. Cl.
CPC ............. *G06F 3/0608* (2013.01); *G06F 3/06* (2013.01); *G06F 3/064* (2013.01); *G06F 3/0679* (2013.01);
(Continued)

(58) Field of Classification Search
CPC ................................ G06F 3/06; G06F 12/00
(Continued)

(56) References Cited

U.S. PATENT DOCUMENTS 3,671,671 A   6/1972  Watanabe
3,731,199 A   5/1973  Tazaki et al.
(Continued)

FOREIGN PATENT DOCUMENTS

DE    2940140 B1    10/1979
EP    0352869 A2    1/1990
(Continued)

OTHER PUBLICATIONS

Definition of Component, Google search , 2017.*
(Continued)

*Primary Examiner* — Tuan V Thai
(74) *Attorney, Agent, or Firm* — Brooks Kushman P.C.

(57) ABSTRACT

Systems and methods for storing and/or communicating digital data associated with amplitudes and phases of a virtual periodic waveform having a designated period between components include, in one embodiment, circuitry that converts a first amplitude and a first phase to a first corresponding voltage or current and applies the first corresponding voltage or current to a first one of the plurality of components, such as conductors connecting integrated circuit chips or capacitors of a DRAM device, and converts the first amplitude and the first phase to (n−1) corresponding voltages or currents based on amplitudes of the periodic waveform phase shifted by about m*(360/n) relative to the
(Continued)

first phase where m is indexed from one to (n−1) and applies each corresponding voltage or current to an associated component. Decoding is performed by comparing magnitudes of the component signals relative to one another rather that to a plurality of thresholds.

17 Claims, 21 Drawing Sheets

(51) Int. Cl.
G11C 11/407 (2006.01)
G11C 16/08 (2006.01)
G11C 7/10 (2006.01)
G11C 11/56 (2006.01)
G06F 13/00 (2006.01)
G11C 11/406 (2006.01)

(52) U.S. Cl.
CPC .......... *G11C 7/1006* (2013.01); *G11C 11/407* (2013.01); *G11C 11/56* (2013.01); *G11C 16/08* (2013.01); *G11C 11/406* (2013.01)

(58) Field of Classification Search
USPC .......................................... 711/100, 103, 154
See application file for complete search history.

(56) References Cited

U.S. PATENT DOCUMENTS

| 3,805,191 | A | * | 4/1974 | Kawai | H04L 27/362 332/145 |
| 3,835,252 | A | | 9/1974 | Ananiades et al. | |
| 3,943,284 | A | | 3/1976 | Nelson | |
| 3,983,323 | A | | 9/1976 | Griffith et al. | |
| 4,280,221 | A | | 7/1981 | Chun et al. | |
| 4,380,060 | A | | 4/1983 | Wilhelm | |
| 4,525,845 | A | | 6/1985 | Dodds et al. | |
| 4,581,691 | A | | 4/1986 | Hock | |
| 4,825,450 | A | | 4/1989 | Herzog | |
| 5,160,929 | A | | 11/1992 | Costello | |
| 5,172,338 | A | | 12/1992 | Mehrotra et al. | |
| 5,235,617 | A | | 8/1993 | Mallard, Jr. | |
| 5,255,287 | A | | 10/1993 | Davies et al. | |
| 5,259,002 | A | | 11/1993 | Carlstedt | |
| 5,341,419 | A | | 8/1994 | Ferry | |
| 5,412,689 | A | | 5/1995 | Can et al. | |
| 5,418,504 | A | | 5/1995 | Nottenburg | |
| 5,553,097 | A | | 9/1996 | Dagher | |
| 5,566,125 | A | | 10/1996 | Fazio et al. | |
| 5,761,246 | A | | 6/1998 | Cao et al. | |
| 5,790,607 | A | | 8/1998 | Burke et al. | |
| 6,005,895 | A | | 12/1999 | Perino et al. | |
| 6,553,079 | B1 | * | 4/2003 | Piirainen | H04L 27/0008 332/145 |
| 6,922,160 | B1 | | 7/2005 | Brown | |
| 7,002,490 | B2 | | 2/2006 | Lablans | |
| 7,064,684 | B2 | | 6/2006 | Lablans | |
| 7,218,144 | B2 | | 5/2007 | Lablans | |
| 7,227,030 | B2 | | 6/2007 | Saka | |
| 7,355,444 | B2 | | 4/2008 | Lablans | |
| 7,365,576 | B2 | | 4/2008 | Lablans | |
| 7,397,690 | B2 | | 7/2008 | Lablans | |
| 7,487,194 | B2 | | 2/2009 | Lablans | |
| 7,505,589 | B2 | | 3/2009 | Lablans | |
| 7,548,092 | B2 | | 6/2009 | Lablans | |
| 7,562,106 | B2 | | 7/2009 | Lablans | |
| 7,580,472 | B2 | | 8/2009 | Lablans | |
| 7,636,396 | B1 | | 12/2009 | Weber, Jr. et al. | |
| 7,643,632 | B2 | | 1/2010 | Lablans | |
| 7,656,196 | B2 | | 2/2010 | Lablans | |
| 7,659,839 | B2 | | 2/2010 | Lablans | |
| 7,722,999 | B2 | | 5/2010 | Levy et al. | |
| 7,725,779 | B2 | | 5/2010 | Lablans | |
| 7,728,816 | B2 | | 6/2010 | Xu et al. | |
| 2003/0023164 | A1 | * | 1/2003 | Eichelberger | A61B 1/313 600/437 |
| 2004/0086059 | A1 | | 5/2004 | Eroz et al. | |
| 2006/0082383 | A1 | * | 4/2006 | Choi | G11C 7/1051 326/30 |
| 2007/0005673 | A1 | | 1/2007 | Lablans | |
| 2007/0098160 | A1 | | 5/2007 | Lablans | |
| 2007/0110229 | A1 | | 5/2007 | Lablans | |
| 2007/0208796 | A1 | | 9/2007 | Lablans | |
| 2007/0226594 | A1 | | 9/2007 | Lablans | |
| 2007/0258516 | A1 | | 11/2007 | Lablans | |
| 2008/0016431 | A1 | | 1/2008 | Lablans | |
| 2008/0016432 | A1 | | 1/2008 | Lablans | |
| 2008/0040650 | A1 | | 2/2008 | Lablans | |
| 2008/0080505 | A1 | * | 4/2008 | Munoz | H04L 45/00 370/392 |
| 2008/0104479 | A1 | | 5/2008 | Lablans | |
| 2008/0244274 | A1 | | 10/2008 | Lablans | |
| 2008/0309436 | A1 | * | 12/2008 | Yamaji | H03F 3/19 333/214 |
| 2009/0040062 | A1 | | 2/2009 | Lang et al. | |
| 2009/0045988 | A1 | | 2/2009 | Lablans | |
| 2009/0060202 | A1 | | 3/2009 | Lablans | |
| 2009/0077151 | A1 | | 3/2009 | Lablans | |
| 2009/0092250 | A1 | | 4/2009 | Lablans | |
| 2009/0138535 | A1 | | 5/2009 | Lablans | |
| 2009/0172501 | A1 | | 7/2009 | Lablans | |
| 2009/0234900 | A1 | | 9/2009 | Lablans | |
| 2009/0295551 | A1 | * | 12/2009 | Dickey | H02J 3/00 340/568.2 |
| 2009/0324253 | A1 | | 12/2009 | Winzer | |
| 2011/0013726 | A1 | | 1/2011 | Voinigescu et al. | |
| 2011/0255870 | A1 | | 10/2011 | Grigoryan et al. | |

FOREIGN PATENT DOCUMENTS

| EP | 0421601 | 4/1991 |
| EP | 1257102 | 11/2002 |
| EP | 1374441 B1 | 9/2006 |
| EP | 0904650 B1 | 9/2007 |
| EP | 2218173 B1 | 11/2011 |

OTHER PUBLICATIONS

International Preliminary Report on Patentability for International Application No. PCT/US2013/076231 dated Jun. 23, 2015.
International Search Report and Written Opinion dated Aug. 24, 2013 for International Application PCT/US2013-039390 filed May 3, 2013.
Ravi Kollipara, et al., "A Way to Meet Bandwidth and Capacity Needs of Next Generation Main Memory Systems", DesignCon 2011.
Gary Breed, "Analyzing Signals using the Eye Diagram", High Frequency Electronics, Nov. 2005, pp. 50-53, Summit Technical Media.
Performance Graphics Memory Interface Solution, Rambus, GDDR Memory Controller Interface Brief, (c) 2005.
Wikipedia, Interconnect bottleneck, "http://en.wikipedia.org/w/index.php?title=Interconnect_bottleneck&oldid=419137288"; Jan. 30, 2012.
Wikipedia, Quadrature amplitude modulation, "http://en.wikipedia.org/wiki/QAM", Feb. 1, 2012.
Rambus, XDR IO Cell, Advance Information, Rambus Confidential, Version 0.71, pp. 1-140, (c) 2002-2005.
Wikipedia, XDR DRAM, "http://en.wikipedia.org/wiki/XDR_DRAM", Jan. 30, 2012.
XAUI interface—Introduction to XAUI—Carrier Metro Ethernet Broadband, www.10gea.org/xaui-interface-introductionto-xaui/, Feb. 1, 2012, pp. 1-8.
Wikipedia, XAUI, "http://en.wikipedia.org/wiki/XAUI", pp. 1-3, Feb. 1, 2012.

* cited by examiner

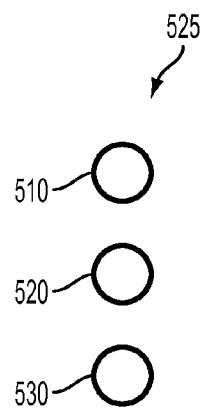
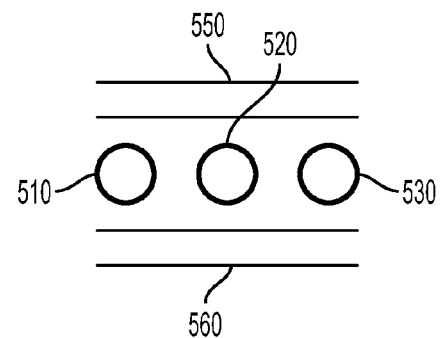
FIG. 5A  FIG. 5B
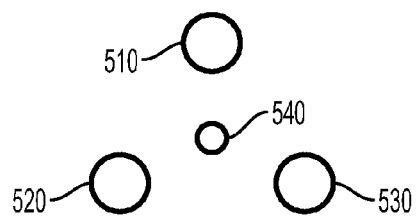
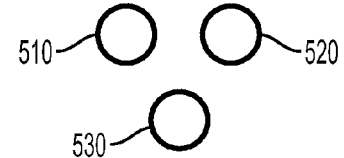
FIG. 5C  FIG. 5D

| AMP | PHASE | Q | R (+120) | S (-120) | Q-R (QR) | S-Q (SQ) | R-S (RS) |
|---|---|---|---|---|---|---|---|
| 0.25 | 30 | 0.125 | 0.125 | -0.25 | 0 | -0.375 | 0.375 |
| 0.25 | 75 | 0.241481 | -0.0647 | -0.17678 | 0.306186 | -0.41826 | 0.112072 |
| 0.25 | 120 | 0.216506 | -0.21651 | 0 | 0.433013 | -0.21651 | -0.21651 |
| 0.25 | 165 | 0.064705 | -0.24148 | 0.176777 | 0.306186 | 0.112072 | -0.41826 |
| 0.25 | 210 | -0.125 | -0.125 | 0.25 | 0 | 0.375 | -0.375 |
| 0.25 | 255 | -0.24148 | 0.064705 | 0.176777 | -0.30619 | 0.418258 | -0.11207 |
| 0.25 | 300 | -0.21651 | 0.216506 | 3.06E-17 | -0.43301 | 0.216506 | 0.216506 |
| 0.25 | 345 | -0.0647 | 0.241481 | -0.17678 | -0.30619 | -0.11207 | 0.418258 |
| 0.5 | 30 | 0.25 | 0.25 | -0.5 | 0 | -0.75 | 0.75 |
| 0.5 | 75 | 0.482963 | -0.12941 | -0.35355 | 0.612372 | -0.83652 | 0.224144 |
| 0.5 | 120 | 0.433013 | -0.43301 | 0 | 0.866025 | -0.43301 | -0.43301 |
| 0.5 | 165 | 0.12941 | -0.48296 | 0.353553 | 0.612372 | 0.224144 | -0.83652 |
| 0.5 | 210 | -0.25 | -0.25 | 0.5 | 0 | 0.75 | -0.75 |
| 0.5 | 255 | -0.48296 | 0.12941 | 0.353553 | -0.61237 | 0.836516 | -0.22414 |
| 0.5 | 300 | -0.43301 | 0.433013 | 6.13E-17 | -0.86603 | 0.433013 | 0.433013 |
| 0.5 | 345 | -0.12941 | 0.482963 | -0.35355 | -0.61237 | -0.22414 | 0.836516 |
| 0.75 | 30 | 0.375 | 0.375 | -0.75 | 0 | -1.125 | 1.125 |
| 0.75 | 75 | 0.724444 | -0.19411 | -0.53033 | 0.918559 | -1.25477 | 0.336216 |
| 0.75 | 120 | 0.649519 | -0.64952 | 0 | 1.299038 | -0.64952 | -0.64952 |
| 0.75 | 165 | 0.194114 | -0.72444 | 0.53033 | 0.918559 | 0.336216 | -1.25477 |
| 0.75 | 210 | -0.375 | -0.375 | 0.75 | 0 | 1.125 | -1.125 |
| 0.75 | 255 | -0.72444 | 0.194114 | 0.53033 | -0.91856 | 1.254774 | -0.33622 |
| 0.75 | 300 | -0.64952 | 0.649519 | 9.19E-17 | -1.29904 | 0.649519 | 0.649519 |
| 0.75 | 345 | -0.19411 | 0.724444 | -0.53033 | -0.91856 | -0.33622 | 1.254774 |
| 1 | 30 | 0.5 | 0.5 | -1 | 0 | -1.5 | 1.5 |
| 1 | 75 | 0.965926 | -0.25882 | -0.70711 | 1.224745 | -1.67303 | 0.448288 |
| 1 | 120 | 0.866025 | -0.86603 | 0 | 1.732051 | -0.86603 | -0.86603 |
| 1 | 165 | 0.258819 | -0.96593 | 0.707107 | 1.224745 | 0.448288 | -1.67303 |
| 1 | 210 | -0.5 | -0.5 | 1 | 0 | 1.5 | -1.5 |
| 1 | 255 | -0.96593 | 0.258819 | 0.707107 | -1.22474 | 1.673033 | -0.44829 |
| 1 | 300 | -0.86603 | 0.866025 | 1.23E-16 | -1.73205 | 0.866025 | 0.866025 |
| 1 | 345 | -0.25882 | 0.965926 | -0.70711 | -1.22474 | -0.44829 | 1.673033 |

FIG. 10A

| qr1 | sq1 | rs1 | MAX | MIN | DEL+ | DEL- | BITS | QR MATCH SET | SQ MATCH SET | RS MATCH SET |
|---|---|---|---|---|---|---|---|---|---|---|
| 6 | 4 | 8 | 8 | 4 | 0.6 | 0.45 | 00000 | 111111000000 | 111100000000 | 111111110000 |
| 8 | 4 | 7 | 8 | 4 | 0.6 | 0.45 | 00001 | 111111110000 | 111100000000 | 111111100000 |
| 8 | 5 | 5 | 8 | 5 | 0.45 | 0.3 | 00010 | 111111110000 | 111110000000 | 111110000000 |
| 8 | 7 | 4 | 8 | 4 | 0.6 | 0.45 | 00011 | 111111110000 | 111111100000 | 111100000000 |
| 6 | 8 | 4 | 8 | 4 | 0.6 | 0.45 | 00100 | 111111000000 | 111111110000 | 111100000000 |
| 4 | 8 | 5 | 8 | 4 | 0.6 | 0.45 | 00101 | 111100000000 | 111111110000 | 111110000000 |
| 4 | 7 | 7 | 7 | 4 | 0.45 | 0.3 | 00110 | 111100000000 | 111111100000 | 111111100000 |
| 4 | 5 | 8 | 8 | 4 | 0.6 | 0.45 | 00111 | 111100000000 | 111110000000 | 111111110000 |
| 6 | 3 | 9 | 9 | 3 | 0.9 | 0.75 | 01000 | 111111000000 | 111000000000 | 111111111000 |
| 9 | 3 | 7 | 9 | 3 | 0.9 | 0.75 | 01001 | 111111111000 | 111000000000 | 111111100000 |
| 9 | 4 | 4 | 9 | 4 | 0.75 | 0.6 | 01010 | 111111111000 | 111100000000 | 111100000000 |
| 9 | 7 | 3 | 9 | 3 | 0.9 | 0.75 | 01011 | 111111111000 | 111111100000 | 111000000000 |
| 6 | 9 | 3 | 9 | 3 | 0.9 | 0.75 | 01100 | 111111000000 | 111111111000 | 111000000000 |
| 3 | 9 | 5 | 9 | 3 | 0.9 | 0.75 | 01101 | 111000000000 | 111111111000 | 111110000000 |
| 3 | 8 | 8 | 8 | 3 | 0.75 | 0.6 | 01110 | 111000000000 | 111111110000 | 111111110000 |
| 3 | 5 | 9 | 9 | 3 | 0.9 | 0.75 | 01111 | 111000000000 | 111110000000 | 111111111000 |
| 6 | 2 | 10 | 10 | 2 | 1.2 | 1.05 | 10000 | 111111000000 | 110000000000 | 111111111100 |
| 9 | 1 | 8 | 9 | 1 | 1.2 | 1.05 | 10001 | 111111111000 | 100000000000 | 111111110000 |
| 11 | 3 | 3 | 11 | 3 | 1.2 | 1.05 | 10010 | 111111111110 | 111000000000 | 111000000000 |
| 9 | 8 | 1 | 9 | 1 | 1.2 | 1.05 | 10011 | 111111111000 | 111111110000 | 100000000000 |
| 6 | 10 | 2 | 10 | 2 | 1.2 | 1.05 | 10100 | 111111000000 | 111111111100 | 110000000000 |
| 3 | 11 | 4 | 11 | 3 | 1.2 | 1.05 | 10101 | 111000000000 | 111111111110 | 111100000000 |
| 1 | 9 | 9 | 9 | 1 | 1.2 | 1.05 | 10110 | 100000000000 | 111111111000 | 111111111000 |
| 3 | 4 | 11 | 11 | 3 | 1.2 | 1.05 | 10111 | 111000000000 | 111100000000 | 111111111110 |
| 6 | 0 | 12 | 12 | 0 | 1.8 | 1.65 | 11000 | 111111000000 | 000000000000 | 111111111111 |
| 11 | 0 | 8 | 11 | 0 | 1.65 | 1.5 | 11001 | 111111111110 | 000000000000 | 111111110000 |
| 12 | 3 | 3 | 12 | 3 | 1.35 | 1.2 | 11010 | 111111111111 | 111000000000 | 111000000000 |
| 11 | 8 | 0 | 11 | 0 | 1.65 | 1.5 | 11011 | 111111111110 | 111111110000 | 000000000000 |
| 6 | 12 | 0 | 12 | 0 | 1.8 | 1.65 | 11100 | 111111000000 | 111111111111 | 000000000000 |
| 1 | 12 | 4 | 12 | 1 | 1.65 | 1.5 | 11101 | 100000000000 | 111111111111 | 111100000000 |
| 0 | 9 | 9 | 9 | 0 | 1.35 | 1.2 | 11110 | 000000000000 | 111111111000 | 111111111000 |
| 1 | 4 | 12 | 12 | 1 | 1.65 | 1.5 | 11111 | 100000000000 | 111100000000 | 111111111111 |

FIG. 10B

| qr1 | sq1 | rs1 | BITS |
|---|---|---|---|
| 0 | 9 | 9 | 11110 |
| 1 | 4 | 12 | 11111 |
| 1 | 9 | 9 | 10110 |
| 1 | 12 | 4 | 11101 |
| 3 | 4 | 11 | 10111 |
| 3 | 5 | 9 | 01111 |
| 3 | 8 | 8 | 01110 |
| 3 | 9 | 5 | 01101 |
| 3 | 11 | 4 | 10101 |
| 4 | 5 | 8 | 00111 |
| 4 | 7 | 7 | 00110 |
| 4 | 8 | 5 | 00101 |
| 6 | 0 | 12 | 11000 |
| 6 | 2 | 10 | 10000 |
| 6 | 3 | 9 | 01000 |
| 6 | 4 | 8 | 00000 |
| 6 | 8 | 4 | 00100 |
| 6 | 9 | 3 | 01100 |
| 6 | 10 | 2 | 10100 |
| 6 | 12 | 0 | 11100 |
| 8 | 4 | 7 | 00001 |
| 8 | 5 | 5 | 00010 |
| 8 | 7 | 4 | 00011 |
| 9 | 1 | 8 | 10001 |
| 9 | 3 | 7 | 01001 |
| 9 | 4 | 4 | 01010 |
| 9 | 7 | 3 | 01011 |
| 9 | 8 | 1 | 10011 |
| 11 | 0 | 8 | 11001 |
| 11 | 3 | 3 | 10010 |
| 11 | 8 | 0 | 11011 |
| 12 | 3 | 3 | 11010 |

FIG. 10C

| AMP | PHASE | Q | R (+90) | S (+180) | T (-90) | Q-R (QR) | R-S (RS) | S-T (ST) | T-Q (TQ) |
|---|---|---|---|---|---|---|---|---|---|
| 0.25 | 30 | 0.125 | 0.216506 | -0.125 | -0.21651 | -0.09151 | 0.341506 | 0.091506 | -0.34151 |
| 0.25 | 75 | 0.241481 | 0.064705 | -0.24148 | -0.0647 | 0.176777 | 0.306186 | -0.17678 | -0.30619 |
| 0.25 | 120 | 0.216506 | -0.125 | -0.21651 | 0.125 | 0.341506 | 0.091506 | -0.34151 | -0.09151 |
| 0.25 | 165 | 0.064705 | -0.24148 | -0.0647 | 0.241481 | 0.306186 | -0.17678 | -0.30619 | 0.176777 |
| 0.25 | 210 | -0.125 | -0.21651 | 0.125 | 0.216506 | 0.091506 | -0.34151 | -0.09151 | 0.341506 |
| 0.25 | 255 | -0.24148 | -0.0647 | 0.241481 | 0.064705 | -0.17678 | -0.30619 | 0.176777 | 0.306186 |
| 0.25 | 300 | -0.21651 | 0.125 | 0.216506 | -0.125 | -0.34151 | -0.09151 | 0.341506 | 0.091506 |
| 0.25 | 345 | -0.0647 | 0.241481 | 0.064705 | -0.24148 | -0.30619 | 0.176777 | 0.306186 | -0.17678 |
| 0.5 | 30 | 0.25 | 0.433013 | -0.25 | -0.43301 | -0.18301 | 0.683013 | 0.183013 | -0.68301 |
| 0.5 | 75 | 0.482963 | 0.12941 | -0.48296 | -0.12941 | 0.353553 | 0.612372 | -0.35355 | -0.61237 |
| 0.5 | 120 | 0.433013 | -0.25 | -0.43301 | 0.25 | 0.683013 | 0.183013 | -0.68301 | -0.18301 |
| 0.5 | 165 | 0.12941 | -0.48296 | -0.12941 | 0.482963 | 0.612372 | -0.35355 | -0.61237 | 0.353553 |
| 0.5 | 210 | -0.25 | -0.43301 | 0.25 | 0.433013 | 0.183013 | -0.68301 | -0.18301 | 0.683013 |
| 0.5 | 255 | -0.48296 | -0.12941 | 0.482963 | 0.12941 | -0.35355 | -0.61237 | 0.353553 | 0.612372 |
| 0.5 | 300 | -0.43301 | 0.25 | 0.433013 | -0.25 | -0.68301 | -0.18301 | 0.683013 | 0.183013 |
| 0.5 | 345 | -0.12941 | 0.482963 | 0.12941 | -0.48296 | -0.61237 | 0.353553 | 0.612372 | -0.35355 |
| 0.75 | 30 | 0.375 | 0.649519 | -0.375 | -0.64952 | -0.27452 | 1.024519 | 0.274519 | -1.02452 |
| 0.75 | 75 | 0.724444 | 0.194114 | -0.72444 | -0.19411 | 0.53033 | 0.918559 | -0.53033 | -0.91856 |
| 0.75 | 120 | 0.649519 | -0.375 | -0.64952 | 0.375 | 1.024519 | 0.274519 | -1.02452 | -0.27452 |
| 0.75 | 165 | 0.194114 | -0.72444 | -0.19411 | 0.724444 | 0.918559 | -0.53033 | -0.91856 | 0.53033 |
| 0.75 | 210 | -0.375 | -0.64952 | 0.375 | 0.649519 | 0.274519 | -1.02452 | -0.27452 | 1.024519 |
| 0.75 | 255 | -0.72444 | -0.19411 | 0.724444 | 0.194114 | -0.53033 | -0.91856 | 0.53033 | 0.918559 |
| 0.75 | 300 | -0.64952 | 0.375 | 0.649519 | -0.375 | -1.02452 | -0.27452 | 1.024519 | 0.274519 |
| 0.75 | 345 | -0.19411 | 0.724444 | 0.194114 | -0.72444 | -0.91856 | 0.53033 | 0.918559 | -0.53033 |
| 1 | 30 | 0.5 | 0.866025 | -0.5 | -0.86603 | -0.36603 | 1.366025 | 0.366025 | -1.36603 |
| 1 | 75 | 0.965926 | 0.258819 | -0.96593 | -0.25882 | 0.707107 | 1.224745 | -0.70711 | -1.22474 |
| 1 | 120 | 0.866025 | -0.5 | -0.86603 | 0.5 | 1.366025 | 0.366025 | -1.36603 | -0.36603 |
| 1 | 165 | 0.258819 | -0.96593 | -0.25882 | 0.965926 | 1.224745 | -0.70711 | -1.22474 | 0.707107 |
| 1 | 210 | -0.5 | -0.86603 | 0.5 | 0.866025 | 0.366025 | -1.36603 | -0.36603 | 1.366025 |
| 1 | 255 | -0.96593 | -0.25882 | 0.965926 | 0.258819 | -0.70711 | -1.22474 | 0.707107 | 1.224745 |
| 1 | 300 | -0.86603 | 0.5 | 0.866025 | -0.5 | -1.36603 | -0.36603 | 1.366025 | 0.366025 |
| 1 | 345 | -0.25882 | 0.965926 | 0.258819 | -0.96593 | -1.22474 | 0.707107 | 1.224745 | -0.70711 |

FIG. 11A

| qr1 | rs1 | st1 | tq1 | BITS | QR MATCH SET | RS MATCH SET | ST MATCH SET | TQ MATCH SET |
|---|---|---|---|---|---|---|---|---|
| 6 | 7 | 6 | 5 | 00000 | 11111100000 | 11111110000 | 11111100000 | 11111000000 |
| 7 | 7 | 5 | 5 | 00001 | 11111110000 | 11111110000 | 11111000000 | 11111000000 |
| 7 | 6 | 5 | 6 | 00010 | 11111110000 | 11111100000 | 11111000000 | 11111100000 |
| 7 | 5 | 5 | 7 | 00011 | 11111110000 | 11111000000 | 11111000000 | 11111110000 |
| 6 | 5 | 6 | 7 | 00100 | 11111100000 | 11111000000 | 11111100000 | 11111110000 |
| 5 | 5 | 7 | 7 | 00101 | 11111000000 | 11111000000 | 11111110000 | 11111110000 |
| 5 | 6 | 7 | 6 | 00110 | 11111000000 | 11111100000 | 11111110000 | 11111100000 |
| 5 | 7 | 7 | 5 | 00111 | 11111000000 | 11111110000 | 11111110000 | 11111000000 |
| 5 | 8 | 7 | 4 | 01000 | 11111000000 | 11111111000 | 11111110000 | 11110000000 |
| 7 | 8 | 5 | 4 | 01001 | 11111110000 | 11111111000 | 11111000000 | 11110000000 |
| 8 | 7 | 4 | 5 | 01010 | 11111111000 | 11111110000 | 11110000000 | 11111000000 |
| 8 | 5 | 4 | 7 | 01011 | 11111111000 | 11111000000 | 11110000000 | 11111110000 |
| 7 | 4 | 5 | 8 | 01100 | 11111110000 | 11110000000 | 11111000000 | 11111111000 |
| 5 | 4 | 7 | 8 | 01101 | 11111000000 | 11110000000 | 11111110000 | 11111111000 |
| 4 | 5 | 8 | 7 | 01110 | 11110000000 | 11111000000 | 11111111000 | 11111110000 |
| 4 | 7 | 8 | 5 | 01111 | 11110000000 | 11111110000 | 11111111000 | 11111000000 |
| 5 | 10 | 7 | 2 | 10000 | 11111000000 | 11111111100 | 11111110000 | 11000000000 |
| 8 | 9 | 4 | 3 | 10001 | 11111111000 | 11111111000 | 11110000000 | 11100000000 |
| 10 | 7 | 2 | 5 | 10010 | 11111111100 | 11111110000 | 11000000000 | 11111000000 |
| 9 | 4 | 3 | 8 | 10011 | 11111111000 | 11110000000 | 11100000000 | 11111111000 |
| 7 | 2 | 5 | 10 | 10100 | 11111110000 | 11000000000 | 11111000000 | 11111111100 |
| 4 | 3 | 8 | 9 | 10101 | 11110000000 | 11100000000 | 11111111000 | 11111111000 |
| 2 | 5 | 10 | 7 | 10110 | 11000000000 | 11111000000 | 11111111100 | 11111110000 |
| 3 | 8 | 9 | 4 | 10111 | 11100000000 | 11111111000 | 11111111000 | 11110000000 |
| 5 | 11 | 7 | 1 | 11000 | 11111000000 | 11111111110 | 11111110000 | 10000000000 |
| 9 | 11 | 3 | 1 | 11001 | 11111111000 | 11111111110 | 11100000000 | 10000000000 |
| 11 | 7 | 1 | 5 | 11010 | 11111111110 | 11111110000 | 10000000000 | 11111000000 |
| 11 | 3 | 1 | 9 | 11011 | 11111111110 | 11100000000 | 10000000000 | 11111111000 |
| 7 | 1 | 5 | 11 | 11100 | 11111110000 | 10000000000 | 11111000000 | 11111111110 |
| 3 | 1 | 9 | 11 | 11101 | 11100000000 | 10000000000 | 11111111000 | 11111111110 |
| 1 | 5 | 11 | 7 | 11110 | 10000000000 | 11111000000 | 11111111110 | 11111100000 |
| 1 | 9 | 11 | 3 | 11111 | 10000000000 | 11111111000 | 11111111110 | 11100000000 |

FIG. 11B

| qr1 | rs1 | st1 | tq1 | BITS |
|---|---|---|---|---|
| 1 | 5 | 11 | 7 | 11110 |
| 1 | 9 | 11 | 3 | 11111 |
| 2 | 5 | 10 | 7 | 10110 |
| 3 | 1 | 9 | 11 | 11101 |
| 3 | 8 | 9 | 4 | 10111 |
| 4 | 3 | 8 | 9 | 10101 |
| 4 | 5 | 8 | 7 | 01110 |
| 4 | 7 | 8 | 5 | 01111 |
| 5 | 4 | 7 | 8 | 01101 |
| 5 | 5 | 7 | 7 | 00101 |
| 5 | 6 | 7 | 6 | 00110 |
| 5 | 7 | 7 | 5 | 00111 |
| 5 | 8 | 7 | 4 | 01000 |
| 5 | 10 | 7 | 2 | 10000 |
| 5 | 11 | 7 | 1 | 11000 |
| 6 | 5 | 6 | 7 | 00100 |
| 6 | 7 | 6 | 5 | 00000 |
| 7 | 1 | 5 | 11 | 11100 |
| 7 | 2 | 5 | 10 | 10100 |
| 7 | 4 | 5 | 8 | 01100 |
| 7 | 5 | 5 | 7 | 00011 |
| 7 | 6 | 5 | 6 | 00010 |
| 7 | 7 | 5 | 5 | 00001 |
| 7 | 8 | 5 | 4 | 01001 |
| 8 | 5 | 4 | 7 | 01011 |
| 8 | 7 | 4 | 5 | 01010 |
| 8 | 9 | 4 | 3 | 10001 |
| 9 | 4 | 3 | 8 | 10011 |
| 9 | 11 | 3 | 1 | 11001 |
| 10 | 7 | 2 | 5 | 10010 |
| 11 | 3 | 1 | 9 | 11011 |
| 11 | 7 | 1 | 5 | 11010 |

FIG. 11C

| Pin | Side B | Side A |
|---|---|---|
| 1 | +12 V | PRSNT1# |
| 2 | +12 V | +12 V |
| 3 | +12 V | +12 V |
| 4 | Ground | Ground |
| 5 | SMCLK | TCK |
| 6 | SMDAT | TDI |
| 7 | Ground | TDO |
| 8 | +3.3 V | TMS |
| 9 | TRST# | +3.3 V |
| 10 | +3.3V aux | +3.3 V |
| 11 | WAKE# | PERST# |
| Key notch | | |
| 12 | Reserved | Ground |
| 13 | Ground | REFCLK+ |
| 14 | Tx+(0) | REFCLK- |
| 15 | Tx-(0) | Ground |
| 16 | Ground | Rx+(0) |
| 17 | PRSNT2# | Rx-(0) |
| 18 | Ground | Ground |
| PCI ×1 board ends at pin 18 | | |
| 19 | Tx+(1) | Reserved |
| 20 | Tx-(1) | Ground |
| 21 | Ground | Rx+(1) |
| 22 | Ground | Rx-(1) |
| 23 | Tx+(2) | Ground |
| 24 | Tx-(2) | Ground |
| 25 | Ground | Rx+(2) |
| 26 | Ground | Rx-(2) |
| 27 | Tx+(3) | Ground |
| 28 | Tx-(3) | Ground |
| 29 | Ground | Rx+(3) |
| 30 | Reserved | Rx-(3) |
| 31 | PRSNT2# | Ground |
| 32 | Ground | Reserved |
| PCI ×4 board ends at pin 32 | | |

| Pin | Side B | Side A |
|---|---|---|
| 1 | +12 V | PRSNT1# |
| 2 | +12 V | +12 V |
| 3 | +12 V | +12 V |
| 4 | Ground | Ground |
| 5 | SMCLK | TCK |
| 6 | SMDAT | TDI |
| 7 | Ground | TDO |
| 8 | +3.3 V | TMS |
| 9 | TRST# | +3.3 V |
| 10 | +3.3 V aux | +3.3 V |
| 11 | WAKE# | PERST# |
| Key notch | | |
| 12 | Reserved | Ground |
| 13 | Ground | REFCLK+ |
| 14 | Tq(0) | REFCLK- |
| 15 | Tr(0) | Rq(0) |
| 16 | Ts(0) | Rr(0) |
| 17 | PRSNT2# | Rs(0) |
| 18 | Ground | Ground |
| PCI ×1 board ends at pin 18 | | |
| 19 | Tq(1) | Reserved |
| 20 | Tr(1) | Rq(1) |
| 21 | Ts(1) | Rr(1) |
| 22 | Ground | Rs(1) |
| 23 | Tq(2) | Ground |
| 24 | Tr(2) | Rq(2) |
| 25 | Ts(2) | Rr(2) |
| 26 | Ground | Rs(2) |
| 27 | Tq(3) | Ground |
| 28 | Tr(3) | Rq(3) |
| 29 | Ts(3) | Rr(3) |
| 30 | Reserved | Rs(3) |
| 31 | PRSNT2# | Ground |
| 32 | Ground | Reserved |
| PCI ×4 board ends at pin 32 | | |

FIG. 19A

| Pin | Side B | Side A |
|---|---|---|
| 33 | Tx+(4) | Reserved |
| 34 | Tx-(4) | Ground |
| 35 | Ground | Rx+(4) |
| 36 | Ground | Rx-(4) |
| 37 | Tx+(5) | Ground |
| 38 | Tx-(5) | Ground |
| 39 | Ground | Rx+(5) |
| 40 | Ground | Rx-(5) |
| 41 | Tx+(6) | Ground |
| 42 | Tx-(6) | Ground |
| 43 | Ground | Rx+(6) |
| 44 | Ground | Rx-(6) |
| 45 | Tx+(7) | Ground |
| 46 | Tx-(7) | Ground |
| 47 | Ground | Rx+(7) |
| 48 | PRSNT2# | Rx-(7) |
| 49 | Ground | Ground |
| PCI ×8 board ends at pin 49 | | |

| Pin | Side B | Side A |
|---|---|---|
| 33 | Tq(4) | Reserved |
| 34 | Tr(4) | Rq(4) |
| 35 | Ts(4) | Rr(4) |
| 36 | Ground | Rs(4) |
| 37 | Tq(5) | Ground |
| 38 | Tr(5) | Rq(5) |
| 39 | Ts(5) | Rr(5) |
| 40 | Ground | Rs(5) |
| 41 | Tq(6) | Ground |
| 42 | Tr(6) | Rq(6) |
| 43 | Ts(6) | Rr(6) |
| 44 | Ground | Rs(6) |
| 45 | Tq(7) | Ground |
| 46 | Tr(7) | Rq(7) |
| 47 | Ts(7) | Rr(7) |
| 48 | PRSNT2# | Rs(7) |
| 49 | Ground | Ground |
| PCI ×8 board ends at pin 49 | | |

FIG. 19B

| Pin | Side B | Side A |
|---|---|---|
| 50 | Tx+(8) | Reserved |
| 51 | Tx-(8) | Ground |
| 52 | Ground | Rx+(8) |
| 53 | Ground | Rx-(8) |
| 54 | Tx+(9) | Ground |
| 55 | Tx-(9) | Ground |
| 56 | Ground | Rx+(9) |
| 57 | Ground | Rx-(9) |
| 58 | Tx+(10) | Ground |
| 59 | Tx-(10) | Ground |
| 60 | Ground | Rx+(10) |
| 61 | Ground | Rx-(10) |
| 62 | Tx+(11) | Ground |
| 63 | Tx-(11) | Ground |
| 64 | Ground | Rx+(11) |
| 65 | Ground | Rx-(11) |
| 66 | Tx+(12) | Ground |
| 67 | Tx-(12) | Ground |
| 68 | Ground | Rx+(12) |
| 69 | Ground | Rx-(12) |
| 70 | Tx+(13) | Ground |
| 71 | Tx-(13) | Ground |
| 72 | Ground | Rx+(13) |
| 73 | Ground | Rx-(13) |
| 74 | Tx+(14) | Ground |
| 75 | Tx-(14) | Ground |
| 76 | Ground | Rx+(14) |
| 77 | Ground | Rx-(14) |
| 78 | Tx+(15) | Ground |
| 79 | Tx-(15) | Ground |
| 80 | Ground | Rx+(15) |
| 81 | PRSNT2# | Rx-(15) |
| 82 | Reserved | Ground |

| Pin | Side B | Side A |
|---|---|---|
| 50 | Tq(8) | Reserved |
| 51 | Tr(8) | Rq(8) |
| 52 | Ts(8) | Rr(8) |
| 53 | Ground | Rs(8) |
| 54 | Tq(9) | Ground |
| 55 | Tr(9) | Rq(9) |
| 56 | Ts(9) | Rr(9) |
| 57 | Ground | Rs(9) |
| 58 | Tq(10) | Ground |
| 59 | Tr(10) | Rq(10) |
| 60 | Ts(10) | Rr(10) |
| 61 | Ground | Rs(10) |
| 62 | Tq(11) | Ground |
| 63 | Tr(11) | Rq(11) |
| 64 | Ts(11) | Rr(11) |
| 65 | Ground | Rs(11) |
| 66 | Tq(12) | Ground |
| 67 | Tr(12) | Rq(12) |
| 68 | Ts(12) | Rr(12) |
| 69 | Ground | Rs(12) |
| 70 | Tq(13) | Ground |
| 71 | Tr(13) | Rq(13) |
| 72 | Ts(13) | Rr(13) |
| 73 | Ground | Rs(13) |
| 74 | Tq(14) | Ground |
| 75 | Tr(14) | Rq(14) |
| 76 | Ts(14) | Rr(14) |
| 77 | Ground | Rs(14) |
| 78 | Tq(15) | Ground |
| 79 | Tr(15) | Rq(15) |
| 80 | Ts(15) | Rr(15) |
| 81 | PRSNT2# | Rs(15) |
| 82 | Reserved | Ground |

FIG. 19C

SYSTEM AND METHOD FOR DIGITAL SIGNALING AND DIGITAL STORAGE

CROSS-REFERENCE TO RELATED APPLICATIONS

This application is the U.S. national phase of PCT Application No. PCT/US2013/076231 filed on Dec. 18, 2013 which claims the benefit of U.S. Provisional Application Ser. No. 61/738,650 filed on Dec. 18, 2012, the disclosures of which are hereby incorporated by reference in their entirety.

This application is related to commonly owned U.S. application Ser. No. 13/474,069 filed May 17, 2012 and international application Serial No. PCT/US13/39390 filed May 3, 2013, the disclosures of which are hereby incorporated by reference in their entirety.

TECHNICAL FIELD

The present disclosure relates to systems and methods for digital signaling and digital storage that may be used in a variety of applications including data input/output for integrated circuit chips and wired networking and digital storage devices such as DRAM and FLASH devices.

BACKGROUND

Decades of increases in transistor density on integrated circuit chips have far outpaced current strategies for getting information onto and off of the chips. The need to have a secure and reliable connection under a wide variety of operating conditions, while retaining the ability to assemble chips into larger modules, has placed hard minimums on the feature sizes of the input/output (I/O) connections. Advances in manufacturing and materials continue to increase the number of transistors that can be positioned on a chip at a rate that approaches the Moore's Law curve. However, the number and size of reliable off-chip connections has nearly reached physical limits. Many prior art approaches have attempted to address this problem.

One approach is to use multiplexed data/address busses. However, with modern microprocessors commonly using 64-bit data and address busses, and some using 128, 256 or more bits, even multiplexing is unable to keep up with the growth in processing power. Furthermore, the increase in processor speed combined with the use of multiple core processors has made even the short time required to multiplex data and addresses onto the same pins a relatively long or slow operation compared to the processing ability of the chip. As such, the I/O has become the rate limiting factor or bottleneck in the system.

As component size decreased, the original ubiquitous DIP package was replaced with miniDIP, and in turn surface-mount technologies like SOP, TSOP, QFP, Pin-Grid Array (PGA), Ball-Grid Array (BGA) and others, all in the attempt to further miniaturize I/O connections and to further increase the information density across the on/off chip interfaces.

In addition to physical packaging constraints, higher frequency signals that are more densely packed present challenges related to electromagnetic interference and cross-coupling of on-chip signals. In particular, as clocking speeds increased, coupling or crosstalk between signals increased, leading to adoption of differential-pair interconnections for transferring high-speed data. While addressing the signal coupling or crosstalk issue, this approach required two I/O connections for each I/O path and therefore did not contribute significantly to increasing I/O capacity.

XAUI, an attachment unit interface standard, and other grouped differential bus standards were created to enable very high speed clocking of the I/O path. However, these standards are also reaching limits as the data transfer speeds approach 40 gigabits-per-second (GBPS) to 100 GBPS. A separate clock (typically 1.25 GHz or a multiple) synchronizes transmitters and receivers at each end of the XAUI bus. Various types of encoding, such as 8b/10b or 64b/66b encoding may be used to aid in synchronization.

As more and more systems begin to incorporate on-the-fly audio and video encoding, it is likely that even combinations of all of the best current approaches will be taxed to keep pace with the ever-increasing bandwidth demands of people, the internet, and the processors that deliver the data.

Various coding strategies have been developed to transmit information over a limited bandwidth channel. One coding strategy used extensively in radio frequency (RF) applications is referred to as Quadrature-Amplitude Modulation (QAM). In this strategy, a sine wave has both its phase and amplitude changed simultaneously to encode information. A QAM diagram has phase and amplitude (or Q and I) axes, with designated "allowable" locations or values (also referred to as stations) for phase/amplitude combinations that define a QAM constellation. The QAM strategy may be referred to by an integer that corresponds to the number of stations in the constellation. As such, a QAM strategy having an arbitrary number "N" of stations in its constellation may be generally referred to as "nQAM".

For example, a typical nQAM with N=16 stations in its constellation (16QAM) may be represented as illustrated in FIG. 1. The vertical axis represents the "Q" (Quadrature or Phase) value of the modulated sine wave while the horizontal axis represents the "I" (In-phase or Amplitude) value. Each station, generally represented by station 20, within the constellation 30 is assigned a value that represents the bits 32 transmitted when that station is visited. In the example illustrated in FIG. 1, each station 20 represents four (4) bits from 0000 to 1111. While a particular pattern of bits 32 may be assigned to any station 20, the stations are typically arranged and numbered using a GRAY code such that only single-bit-changes occur between adjacent stations. For example, station 24 has an associated bit pattern 34 of "0101". Adjacent station 26 has an associated bit pattern 36 of "0100" that differs from bit pattern 34 by a single bit. Similarly, adjacent station 28 has an associated bit pattern 38 of "0001" that differs from bit pattern 34 by a single bit.

Conventional implementations of a QAM coding strategy to transfer data use a base sine wave with one or more devices to provide near-instantaneous modification of the phase and/or amplitude of the sine wave to transition from one constellation station to another. One technique generates phase-locked sine and cosine waves, using the Q value to modulate the amplitude of the cosine wave, and the I value to modulate the amplitude of the sine wave. The two waves are then combined using a mixer to create the transmitted RF output. The channel bandwidth required for transmitting the data is determined by the symbol rate and Nyquist's theorem.

Multiple simultaneous streams of information can be transferred using wideband transmitters/receivers in combination with multiple center-carrier sine waves of different frequencies, separated by at least the bandwidth of each individual information stream.

Recent increases in demand for internet bandwidth-to-the-home have taxed the limits of earlier modulation techniques over the ubiquitous twisted-pair copper wires used for POTS (Plain Old Telephone Service) delivery. The International Telecommunications Union (ITU) has responded to this rapid ramp-up in bandwidth demand by promulgating standards that continue to evolve. Beginning with DSL, the standards that provide additional bandwidth delivery include VDSL (G993.1) and VDSL2 (G993.2). These standards use RF over twisted-pair copper wires in combination with coding techniques such as QAM to create multiple subscriber bands over a single twisted pair.

While such standards are being used to address the bandwidth demands of multi-drop lines from a central office or headend servicing various subscribers, they are overly complex and not currently practical for typical digital systems where most of the information is transferred point-to-point with fan-out handled by dedicated nodes rather than multi-drop lines (e.g. single card, or backplane-interconnected cards, or wire-and-hub networking). At very high speeds, the stubs associated with multiple listeners become difficult to manage, and line reflections, in-coupled noise, and other issues quickly drive high-speed data systems to full-mesh point-to-point designs. Furthermore, attempting to reduce the size of the required encoders, transmitters, receivers, and decoders for VDSL and/or VDSL2 systems so that they could be used as generic chip-to-chip interfaces is beyond problematic.

Digital systems are prone to significant spectral emissions, especially as processor and data rates have continued to increase. To significantly reduce emissions, many modern designs use differential pair signaling and run the differential pairs for XAUIs and other high speed connections on interior layers of a chip or card sandwiched between ground and/or voltage planes to guarantee low radiated emissions from the high speed lines. Radiated emissions are generated in response to switching transients. For example, as a bit on a CMOS integrated circuit changes state from 0 to 1 or from 1 to 0, the nature of the circuit design results in a brief moment when there is a relatively high current flow from power to ground, resulting in a current (and emissions) spike. The switching periods also account for the bulk of the power consumed in CMOS integrated circuits. This is true even for differential pairs, where the two wires are switched to opposite states. During the transition, there are high voltage and current transients in both wires. With perfect switching these transients would be exactly in synch and of opposite sign and would still cancel in the far field. Unfortunately, switching is rarely perfect so switching transients radiate even from well-matched differential pairs.

As such, the present disclosure recognizes a need for increasing the capacity of existing integrated circuit I/O without consuming significant on-chip resources or power budgets, and without a significant increase in radiated emissions.

In addition, the present disclosure recognizes that storage of information requires storing and recovery of the voltage/current used for transmitting this information, and that the most space-efficient mechanisms use a single capacitor to store a bit as a voltage.

SUMMARY

Systems and methods for digital signaling and storage utilize a coding strategy that facilitate decoding with desirable noise immunity using fewer components based on relative magnitudes of voltage/current signals within a signaling cluster. In one embodiment, voltage/current signals within a cluster sum to substantially zero. Other embodiments provide at least one bias voltage for each cluster such that a group of clusters encodes additional bits. In one embodiment, a bias is provided to a differential pair to increase the number of bits per pair. A different bias may be provided to each differential pair within a group or cluster of differential pairs to encode additional multi-bit symbols using the biases.

Various embodiments of the present disclosure include digital storage devices that code stored data using clusters of components within the storage device to represent a multi-bit symbol. In one embodiment, a dynamic random access memory (DRAM) storage device uses clusters of N capacitors to store an M-bit constellation signal, where M is greater than N, which facilitates either size reduction of memory arrays or increased storage capacity for a particular size array.

In one embodiment, a method for coding digital data by first, second, and third devices includes associating the digital data with corresponding unique two-dimensional coordinates representing amplitude and phase of a periodic waveform having a period of 360 degrees, converting the amplitude and the phase to a first corresponding voltage or current and applying the voltage or current to the first device, converting the amplitude and the phase to a second corresponding voltage or current based on a value of the periodic waveform phase shifted by 120 degrees relative to the amplitude and the phase and applying the second corresponding voltage or current to the second device, and converting the amplitude and the phase to a third corresponding voltage or current based on a value of the periodic waveform phase shifted by 240 degrees (or equivalently −120 degrees) relative to the amplitude and the phase and applying the third corresponding voltage or current to the third device. The method may also include comparing differential voltage or current between pairs of the first, second, and third devices relative to one another and/or to zero to decode the digital data. A peak magnitude of the voltage/current over one period may be used in combination with the relative magnitudes in decoding the symbol and associated bits. In one embodiment, the first, second, and third devices are implemented by conductors extending between components. In another embodiment, the first second, and third devices are implemented by capacitors within a DRAM. Embodiments also include coding of digital data stored to and read from digital storage media such as FLASH memory, magnetic disk or tape, and optical disk or tape.

In various embodiments, the digital data comprises a multiple-bit binary word having "n" bits and the plurality of thresholds is less than $2^n$. Various embodiments may include comparing differential voltage or current between first and second conductors, first and third conductors, and second and third conductors to determine an associated symbol without comparing the absolute value (amplitude or magnitude) to a plurality of thresholds. This strategy requires fewer comparators than previously described approaches to decode a transmitted or stored symbol and its corresponding bits.

Embodiments according to the present disclosure may also include a system for communicating or storing digital data associated with amplitudes and phases of a periodic waveform having a specified periodicity, such as a period of 360 degrees, using a plurality of n components and circuitry that converts a first amplitude and a first phase to a first corresponding voltage or current and applies the first corresponding voltage or current to a first one of the plurality of components, and converts the first amplitude and the first phase to (n−1) corresponding voltages or currents based on amplitudes of the periodic waveform phase shifted by about m*(period/n) relative to the first phase where m is indexed from one to (n−1), and applies each corresponding voltage or current to an associated component of the plurality of n components. In various embodiments, the voltages or currents applied to the plurality of components sum to substantially zero. In some embodiments a bias voltage or current is applied to each of the n components. Different biases may be applied to different groups of clusters of components. Components, such as conductors, capacitors, or other devices may be adjacent to other components within a cluster, or may be physically separated to further enhance reliability. Embodiments may include circuitry that compares voltage or current of each of the plurality of n components to other components within a signaling cluster or group of clusters. Embodiments may also include circuitry that generates a differential voltage or current for each unique pair of the plurality of n components and decodes symbols of a constellation based on relative differences among the differential voltages or currents rather than comparing to associated thresholds.

Various embodiments according to the present disclosure may provide a number of advantages. For example, systems and methods according to the present disclosure facilitate a substantial increase in the input/output capacity of various wired communication/networking applications and storage capacity (or reduced array size) of various digital storage devices. Various embodiments decode multi-bit symbols using relative voltage/current magnitude of components within a signaling cluster rather than comparing absolute signal levels to associated thresholds. In one embodiment, a peak current/voltage value is detected and compared to a threshold and used in combination with the relative voltage/current magnitudes of various signal pairs to decode a symbol. Various embodiments according to the present disclosure may provide an order of magnitude or more increase in I/O data rates or storage capacity.

Embodiments according to the present disclosure address the I/O bottleneck encountered by parallel high-speed systems and provide a path forward that should remove I/O pad size from being the limiting factor for integrated circuit I/O for the foreseeable future. In addition, various embodiments according to the present disclosure provide a general framework for digital signaling over multiple conductors that may reduce power consumption and radiated emissions for high-speed digital data transfer in a wide variety of applications.

BRIEF DESCRIPTION OF THE DRAWINGS

FIGS. 5A-5D illustrate representative arrangements for three-conductor signaling clusters for I/O signaling using multi-phase wired signaling according to various embodiments of the present disclosure;

FIGS. 10A-10C illustrate operation of a system or method for decoding data in response to received differential voltages/currents in a tri-phase wired signaling strategy according to various embodiments of the present disclosure;

FIGS. 11A-11C illustrate operation of a system or method for decoding data in response to received differential voltages/currents in a quad-phase wired signaling strategy according to various embodiments of the present disclosure;

FIGS. 19A-C illustrate a representative implementation of a digital signaling embodiment according to the present disclosure applied to an existing PCI Express (PCI-E) application.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
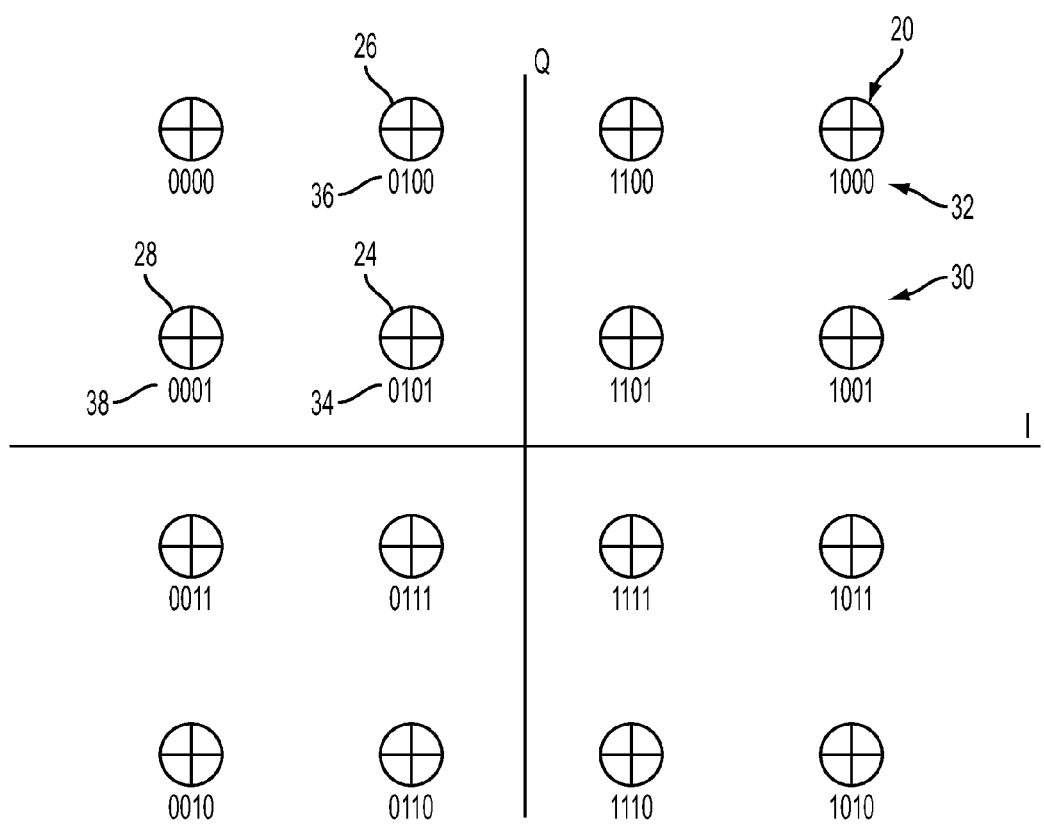
FIG. 1 illustrates a two-dimensional constellation diagram for a 16-symbol embodiment of a system or method according to the present disclosure.

FIG. 1 illustrates a constellation diagram for a 16-symbol embodiment of a system or method for digital signaling that may be used for integrated circuit chip input/output according to the present disclosure. While described above with reference to use in an RF implementation that may be transmitted over a twisted pair, for example, a similar constellation diagram may be used to implement poly-phase or multi-phase wired N-symbol signaling according to various embodiments of the present disclosure. As described in greater detail herein, embodiments according to the present disclosure use n-symbol signaling, such as represented by the 16-symbol constellation 30 of FIG. 1, to code the stations or symbols using voltage/current changes among a group of signaling conductors. For example, a typical N-symbol or N-QAM strategy with N=16 stations or symbols in its constellation may be represented as illustrated in FIG. 1. The stations are arranged within an n-dimensional coordinate system, which is a 2-dimensional coordinate system in this example. While the selected coordinate system and labeling is independent of the invention as described herein, it is useful to explain operation of representative embodiments using the nomenclature and two-dimensional coordinate system of traditional QAM signaling. As described below, particular applications or implementations may select or position the stations/symbols to provide desired system operating characteristics.

As illustrated in FIG. 1, the vertical axis may be thought of as representing the "Q" (Quadrature or Phase) value of a modulated sine wave while the horizontal axis may be thought of as representing the "I" (In-phase or Amplitude) value. Each station, generally represented by station 20, within the constellation 30 is assigned digital data represented by multiple-bit binary pattern 32 that can be considered to be transmitted when the station is visited. As described in greater detail herein, the station or symbol coordinates are communicated between a transmission/encoding device and a receiving/decoding device such that the digital data is recovered from the station/symbol location or coordinates. In the example illustrated in FIG. 1, each station 20 has an associated unique multiple-bit binary pattern 32 with four (4) bits. In a 4-bit strategy, there are $2^4$ or 16 permutations or bit patterns that vary from 0000 to 1111. While a particular pattern of bits 32 may be assigned to any station 20, various advantages with respect to error detection and correction may be obtained if the stations are arranged and numbered using a gray code such that only single-bit-changes occur between adjacent stations. For example, station 24 has an associated bit pattern 34 of "0101". Adjacent station 26 has an associated bit pattern 36 of "0100" that differs from bit pattern 34 by a single bit. Similarly, adjacent station 28 has an associated bit pattern 38 of "0001" that differs from bit pattern 34 by a single bit.

Conventional QAM modulates a base or carrier sine wave using one or more devices to provide near-instantaneous modification of the phase and/or amplitude of the sine wave to transition from one constellation station to another. One technique generates phase-locked sine and cosine waves, using the Q value to modulate the amplitude of the cosine wave, and the I value to modulate the amplitude of the sine wave. The two waves are then combined using a mixer to create the modulated radio frequency (RF) output that is transmitted between sending and receiving stations. The channel bandwidth required for transmitting the data is determined by the symbol rate and Nyquist's theorem.

Transmitting data using conventional N-QAM over conductors arranged as a differential pair in the digital world would require transmitting a differential sine wave signal of sufficiently high frequency that the N-QAM modulation-induced bandwidth remains well above DC. For a 10 giga-bit-per-second data rate, using 256-QAM to encode eight bits per symbol, a symbol rate of 1.25 GHz is required, requiring a multi-gigahertz carrier (and inverse) whose phase is precisely controlled. The existing XAUI interfaces achieve this bit rate by using a 64-bit parallel bus clocked at 156.25 MHz. However, transmitting a modulated carrier which contains this information density would require a much higher line frequency. As the current signaling strategies are already approaching physical limits for wire-based frequencies, increasing the base frequency significantly above the current bit rates is not a practical solution.

As recognized by the present disclosure, instead of transmitting a modulated carrier in a differential pair implementation, in various embodiments the Q-axis station coordinate may be represented by the voltage or current on one of the pair of conductors or wires, and the I-axis coordinate may be represented by the voltage or current on the other of the pair to encode a quasi-QAM signal as a pair of voltages or currents on corresponding conductors of the differential pair. In a 16-symbol constellation, each group of four bits may be encoded by voltage/current values representing the coordinates or location of the symbol/station in the constellation, with one dimension represented by the voltage/current on the Q-conductor, and the other dimension represented by the voltage/current on the Mine. Those of ordinary skill in the art will recognize that the voltages or currents can be coupled onto the respective conductors using well-known circuitry/electronics. For example, a voltage-follower design or switchable current-source design may be used to apply the corresponding voltage or current, respectively. A separate clock that identifies symbol intervals may be used to synchronize the devices at each end of the conductors to synchronize transmitters and receivers. This approach of representing the symbol or station location on the Q and I axes from a QAM constellation by a voltage (or current) of a pair of conductors can be generalized or extended to multiple conductors associated with stations arranged within an n-dimensional coordinate system.

For example, the signaling strategy described above can be extended to a three-dimensional N-symbol constellation by adding a third conductor to communicate voltage or current states associated with the third dimension or coordinate component of a particular symbol/station. Similarly, a four-dimensional system or method can be used with four conductors each assigned to one dimension of the coordinates, and so on. In a four-wire system with only four voltage or current states per wire, this strategy can transmit one eight-bit symbol per transition, using only four conductors as compared to the 16 conductors required by an eight-bit XAUI interface.

As recognized by the present disclosure, this signaling strategy raises potential issues with respect to practical implementations, such as generating precision voltages or currents to represent the different stations and corresponding locations/coordinates within the constellation. Likewise, similar to traditional differential pair signaling strategies that use capacitive coupling to apply the signals to the conductors, continuous transmission of a single bit value could saturate the coupling capacitors at either end of the pair. As such, encoding methods such as 8b/10b or similar line coding techniques with embedded commands may be used to allow bit randomization/inversion to avoid these conditions. Furthermore, differential pairs are used in many conventional strategies because the EM fields from the pair self-cancel in the far field if impedance is correctly controlled and wire lengths match closely. While the signaling strategy described above does not utilize a traditional differential pair, the radiated emissions may be managed and may be acceptable for many applications as described below.

Precision Voltages

As long as the stations in the constellation represent voltages which are offset by easily-generated gaps (e.g. on the order of a diode-drop), those of ordinary skill in the art may recognize that generating precision voltage/current references on both transmit and receive devices is fairly straight-forward. While thermal gradients between transmit and receive devices may impact the matching from device to device, protocols analogous to line coding protocols such as 8b/10b, 64b/66b, or Transition Minimized Differential Signaling (TMDS), for example, can be used to send packets of data which exercise the full range on the transmitter so the receiver can perform local calibration and adjust to drift across time/temperature.

If stations represent currents rather than voltages, precision current sources can be provided that are summed through a precision Norton-style amplifier to create the pin or conductor current. Analogous encoding methods can be used for data transport and similar calibration and drift compensation can be done in a current-based design.

Driver design has already been briefly described. In one implementation, a bank of precision voltages is generated, and a low-impedance-output, high-impedance-input voltage-follower is switched via pass-gates from one voltage to another by a decoder fed by the bits which control that particular pin/conductor from the set of bits associated with the currently transmitting symbol. The follower is designed to generate an edge compliant with design specifications that may vary by application or implementation.

Capacitor Saturation

In XAUIs and similar capacitive-coupled data transfer systems, encoding strategies such as 8b/10b or 64b/66b are used for the data to control DC balance, emissions, transition density, etc. To provide desired DC balance, a given wire should transition from one sign to the opposite sign regularly, similar to a differential pair design. However, in contrast to the XAUI and similar implementations, in systems and methods for digital signaling according to various embodiments of the present disclosure, the capacitors are no longer switching between fully charged and discharged states. Rather, the capacitors are switching between rates of charging and discharging. A similar encoding system can readily be used in various embodiments according to the present disclosure that monitor the transmitted bit stream and shuffle bit order, bit encoding, etc., to maintain DC balance, emissions, effective transition density, etc., analogous to the 8b/10b, 64b/66b, and other line coding or encoding systems familiar to those of ordinary skill in the art.

In one embodiment, DC balance across the conductors within a particular signaling group is managed by changing the corresponding conductor associated with a particular dimension of the n-dimensional coordinates. For example, in a 4-wire (4-dimensional) implementation with each station/symbol having coordinates associated with a 4-dimensional coordinate or 4-tuple vector such as <a,b,c,d>, the dimension or component (such as "a") communicated by a particular conductor $c_1$ can be periodically changed (switched to one of the "b", "c", or "d" components) to manage DC balance across all wires.

Emissions

Digital systems are prone to significant spectral radiated emissions, especially as processor and data rates have continued to increase. To reduce emissions, many modern designs run differential pairs for XAUI and other high speed connections on interior layers of a card or circuit board, with ground and/or voltage planes above and below the pairs to reduce radiated emissions from the integrated circuit chip. This technique can be used with the signaling strategies according to various embodiments of the present disclosure as well to manage emissions by placing the signaling conductors between conductive ground or voltage planes of the integrated circuit chip or system card/circuit board.

Emissions are also related to the edge speeds of the transmitted signals. The signaling strategy according to various embodiments of the present disclosure permits transmission of multiple bits per symbol, i.e. voltage change on one or more wires. As such, the signaling strategy of various embodiments according to the present disclosure facilitates reduced symbol rates and associated reduction in edge rates and radiated emissions. Those of ordinary skill in the art will recognize that drivers have already been designed to drive specified loads with guaranteed edge rates. As such, the voltage-follower approach described above as a representative driver implementation for a signaling strategy as described herein is a straight-forward modification of existing designs.

Radiated emissions can also be managed by limiting or restricting voltage/current transitions to one conductor at a time within a cluster of signaling conductors, i.e. adjacent symbol coordinates vary by only a single dimension. Embodiments that operate with such a constraint may have advantages with respect to error detection and correction and/or better noise immunity. For example, embodiments that use this strategy have the advantage on the receiver side of being able to assume that any voltage/current change in the stable or unchanging conductor(s) maps to a common-mode change in the conductor that is anticipated to change voltage/current levels. This is generally a valid assumption as most transients common-mode couple onto adjacent conductors. In a 256-symbol system, this means that a symbol-change effectively transmits only four bits of information because from any given station, the next symbol must be adjacent, i.e. the subsequent symbol can only be a side-to-side or up-and-down station movement depending on which conductor is scheduled to move during the current symbol window or time interval.

Finally, in the layout of the signaling conductors, a ground conductor can be incorporated into each symbol-carrying conductor cluster. This will reduce or prevent coupling of signals from the outside conductor(s) of a cluster to the outside conductor(s) of an adjacent cluster.

As those of ordinary skill in the art may recognize, managing radiated emissions may be the most difficult challenge for the signaling method described above that assigns and uses a conductor for each coordinate of the symbol in a particular signaling constellation because there is no longer a true differential pair whose EM emissions cancel in the far field. For lower data rates, however, this strategy may be sufficient for a number of applications and offers enormous potential for bandwidth gain across existing I/O boundaries with low circuit-area impact on the transmit/receive sides of the boundary. Differential signaling could also be employed without loss of generality where each differential pair transmits a positive and a negative signal value for the given symbol coordinate dimension. While this would double the number of conductors needed relative to a single conductor per dimension, the bandwidth increase by using the non-binary encoding still reduces the total number of conductors relative to various prior art implementations.

Those of ordinary skill in the art will recognize that the standard oscilloscope-based "eye diagram" for determining signal quality is no longer available as an analysis tool for signaling strategies according to various embodiments of the present disclosure. Rather, a plot of the constellation points or symbol coordinates over a long dwell with every constellation point visited may be used to determine the system fidelity. Systems with high fidelity will exhibit a smaller variance around the ideal symbol coordinates whereas lower fidelity will result in a constellation diagram having broad/blurry/smeared symbol points or stations.

Multi-Phase Wired n-Symbol Signaling

As recognized by the present disclosure, switching transients are a significant source of radiated emissions from digital equipment. As a bit on a CMOS integrated circuit changes state from 0 to 1 or from 1 to 0, the nature of the design has a brief moment when there is a relatively high current path from power to ground, resulting in a current spike and associated emissions. This occurs even on differential pairs, where the two conductors are substantially simultaneously switched to opposite states. During the transition, there are high voltage and current transients in both conductors. With ideal switching, these transients would be exactly synchronized and have opposite sign/sense such that they would cancel in the far field. In actual implementations, however, switching is rarely perfect and the switching transients result in radiated emissions, even from well-matched differential pairs.

As also recognized by the present disclosure, power generation companies have long used three-phase conductors for long-distance power transmission, with each conductor carrying a voltage or current that is 120° phase advanced or retarded relative to an adjacent conductor. For a three-wire/conductor cluster, relative phasing of 0°, 120°, and 240°, or alternately, 0°, 120°, and −120° may be used. Analysis of this power transmission strategy reveals that power per unit time is constant as long as demand on each conductor is identical.

The present disclosure also recognizes that the bulk of the power consumed in CMOS integrated circuits implementing traditional signaling strategies is associated with switching between states. The voltage across the CMOS device remains fairly constant (with good capacitive decoupling), but very large current transients occur at every gate that changes binary state.

As such, the ability to use wired n-symbol signaling with more than two conductors may be used to advantage in various embodiments according to the present disclosure to create a system having the capability to transmit data from one device to another device using near constant power and near zero radiated emissions. With careful design, switching transients associated with transitions from one transmitted symbol to another, and power fluctuations on either the transmitter or the receiver can be reduced or eliminated. While currently suitable for a wide variety of I/O applications, including integrated circuit chip and microprocessor I/O, the polyphase signaling strategy of various embodiments of the present disclosure may also be used internally within an integrated circuit chip as die-shrink continues to enable miniaturization of more complex devices. In addition, appropriate selection and design of transmitter/receiver drivers may also facilitate lower total power consumption relative to existing I/O signaling strategies.

Figure 2:
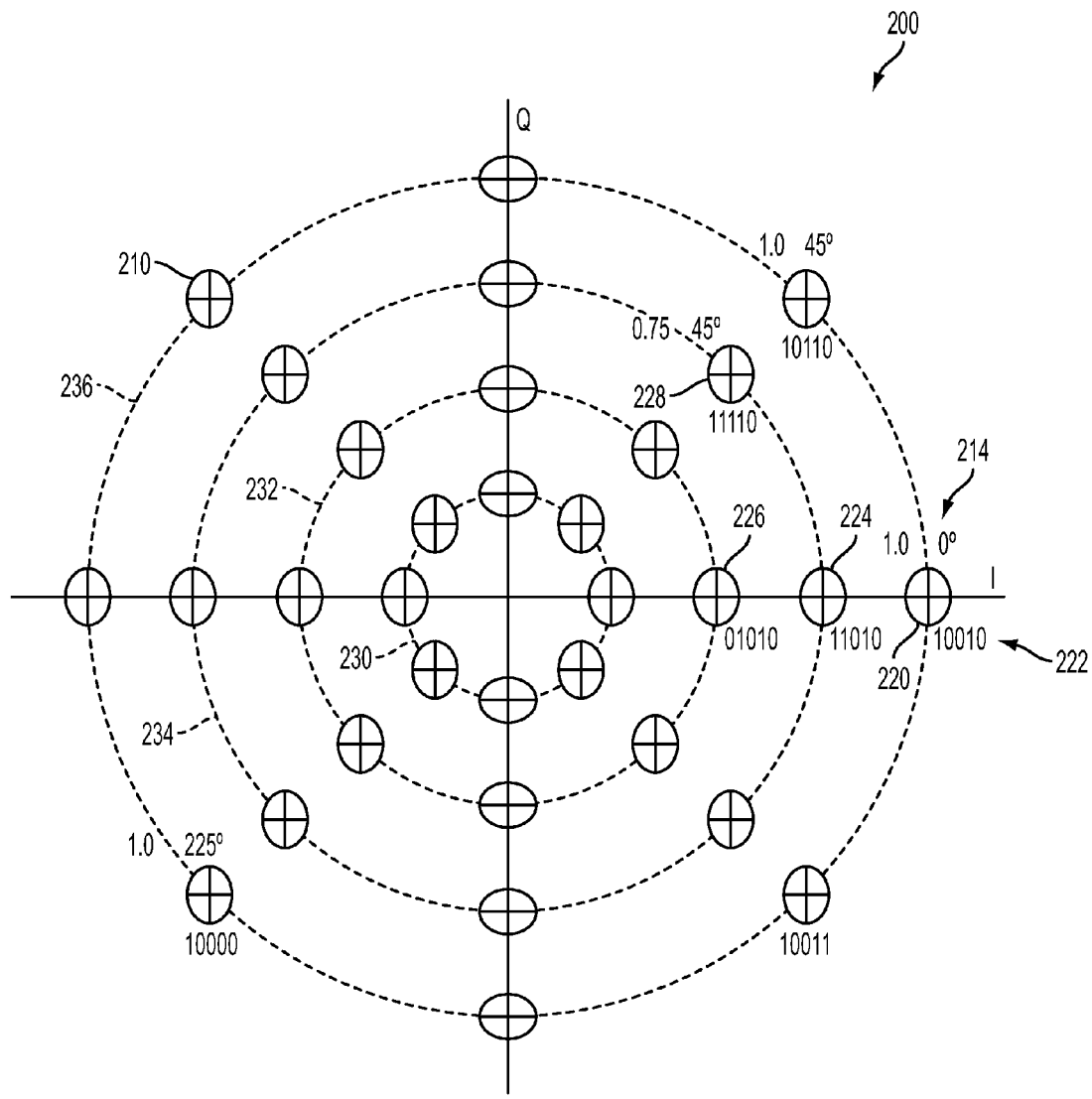
FIG. 2 illustrates a two-dimensional constellation diagram for a 32-symbol embodiment of a system or method according to the present disclosure.

FIG. 2 illustrates a two-dimensional constellation diagram 200 for a 32-symbol embodiment of a system or method according to the present disclosure. The two-dimensional coordinate system illustrated in FIG. 2 continues to use QAM nomenclature without loss of generality. Constellation diagram 200 includes 32 symbols or stations 210. In the representative embodiments described below, the symbol or station coordinates can be represented by an I-axis coordinate that may also represent amplitude of a periodic (virtual) waveform used to encode or determine transmitted voltage/current values, analogous to a QAM signal if the data were being transmitted via a modulated RF sine wave. Those of ordinary skill in the art will recognize that the periodic waveform having a period of 360° is used only to determine values for the polyphase signaling strategy and that the waveform is not a physical signal. Rather, the values determined using the periodic waveform may be stored in a look-up table, or may be hard-coded or firm-coded in a gate array and/or by corresponding selection of component values used in the transmit/receive driver circuitry. Because the periodic waveform is used only to determine the signaling voltage/current values for each conductor within a signaling cluster of conductors and is not actually transmitted as a signal on any of the conductors, the periodic waveform is referred to as a virtual waveform. In the embodiment illustrated in FIGS. 2-4, a sinusoidal waveform is used and referred to as a virtual sine wave ("VSW"). The VSW may represent voltage, current, or power depending on the particular application and implementation. For applications or implementations where the VSW represents power, constant power and near-zero switching transients can be achieved as described in greater detail herein. Without loss of generality and continuing the use of QAM nomenclature, the other coordinate axis may be designated the Q-axis and may be thought of as analogous to the phase that the VSW would have if it were actually transmitted in a conventional RF QAM strategy.

As previously described and illustrated in the constellation diagram 200 of FIG. 2, each symbol or station 210 has associated n-dimensional coordinates 214 that may be represented by an I-component and a Q-component in a rectilinear coordinate system, for example. Alternatively, the location or coordinates of each symbol may be expressed as an n-tuple vector having a magnitude (or amplitude) and phase angle. For example, symbol 220 may be identified by an n-tuple <1.0,0> having a first component "1.0" representing an amplitude, and a second component "0" representing a phase or phase angle. The amplitude and phase (or other coordinate representation) may be used to specify a first voltage/current value corresponding to a point on the periodic waveform, or VSW in this example, that is then used to determine or generate additional voltages/currents based on phase shifted values of the period waveform for each of the conductors within the signaling cluster as described in greater detail below.

As with the constellation diagram of FIG. 1, each station or symbol 210 in the constellation diagram 200 of FIG. 2 includes associated digital data, represented by a unique multiple-bit binary pattern 222, that is communicated to, and decoded by, the receiver via detection of the associated symbol coordinates. In the representative constellation diagram 200, the 32 symbols 210 are arranged generally symmetrically and spaced at 45 degree intervals with unique multiple-bit binary patterns 222 assigned using a gray code such that only a single bit changes between two adjacent symbols. For example, binary pattern 224 (11010) differs by only a single bit relative to binary pattern 220 (10010), binary pattern 226 (01010), and binary pattern 228 (11110), etc. In this example, symbols 210 are arranged around circles 230, 232, 234, 236 having radial values or amplitudes of 0.25, 0.50, 0.75, and 1.0, respectively. Those of ordinary skill in the art will recognize that the symbol/station locations may be assigned to achieve desired system performance and that the signaling strategy is generally independent of the particular location assignment and associated digital data/binary pattern. Similarly, although the constellation diagrams illustrated in FIGS. 1 and 2 have generally symmetrically, regularly spaced stations, an asymmetric configuration may be used depending on the particular application and implementation.

Figure 3:
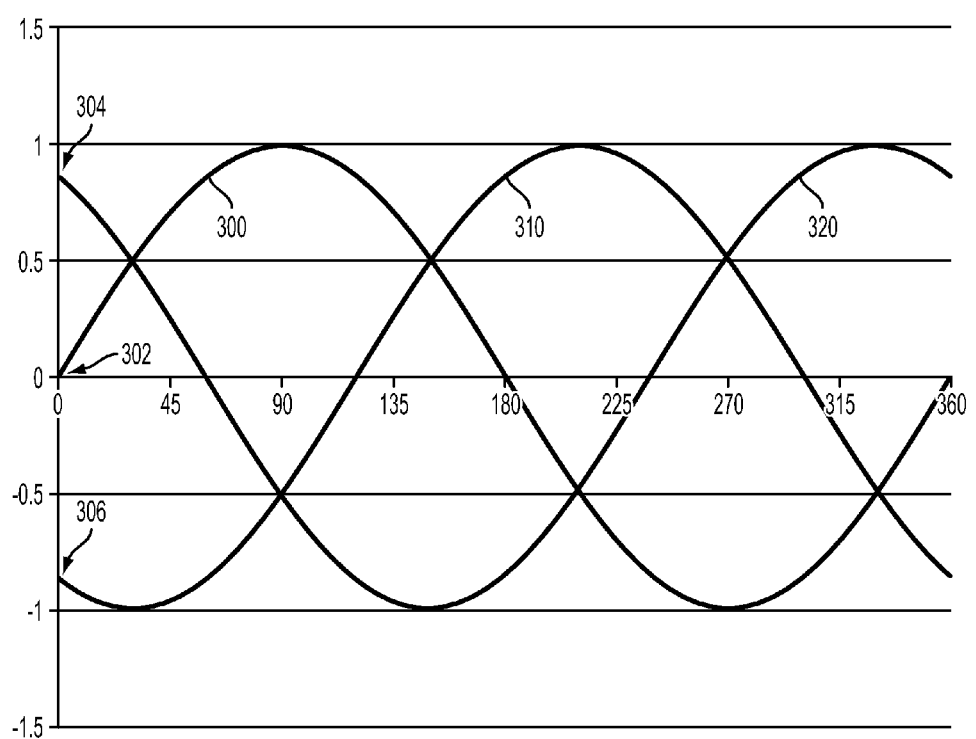
FIG. 3 illustrates a representative virtual periodic waveform having a designated period of 360 degrees in addition to phase-shifted versions of the waveform for use in generating voltages or currents representing digital data in various embodiments of a system or method according to the present disclosure.

FIG. 3 illustrates a representative virtual periodic waveform having a designated period of 360 degrees in this example, in addition to phase-shifted versions of the waveform for use in generating voltages or currents representing digital data in various embodiments of a system or method according to the present disclosure. In the representative embodiment illustrated in FIG. 3, periodic waveform 300 represents a VSW having an amplitude of 1.0. Waveforms 310, 320 are shown to illustrate the same waveform 300 phase shifted by 120° and 240° (or equivalently −120°), respectively. Those of ordinary skill in the art will recognize that the VSW may have a different designated period, or may be implemented by a periodic waveform other than a sine wave depending on the particular application and implementation.

Figure 4:
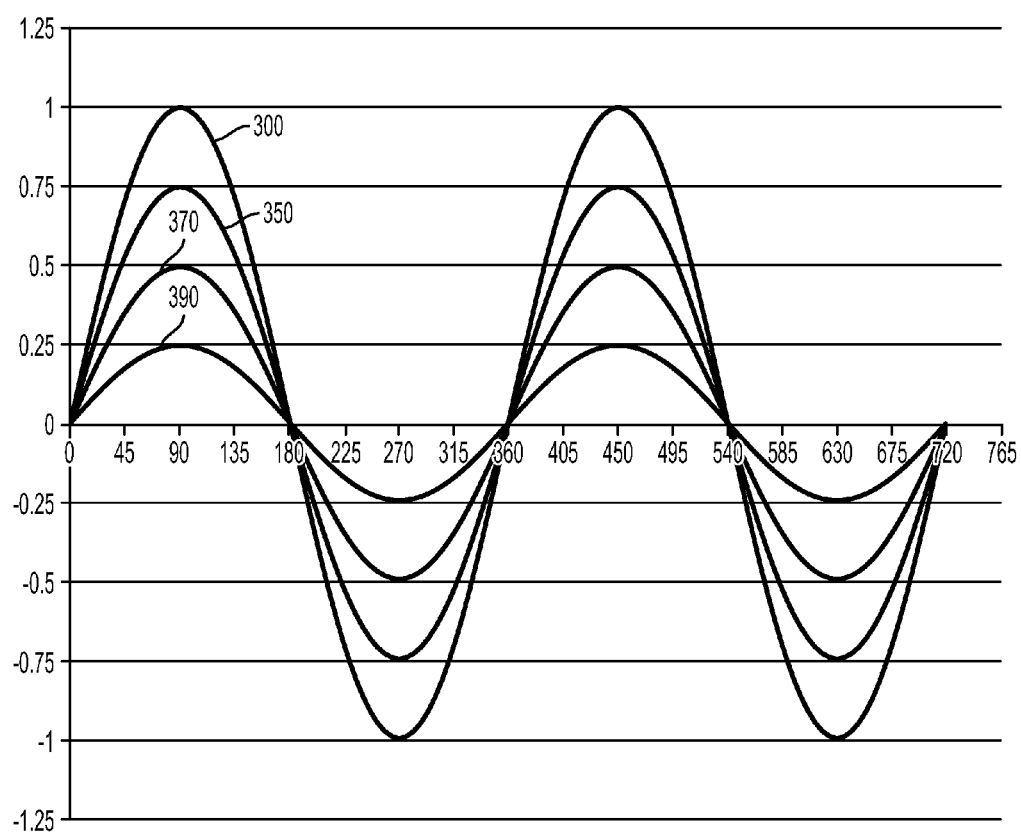
FIG. 4 illustrates representative virtual periodic waveforms having a designated period of 360 degrees and different amplitudes for use in generating voltages or currents representing digital data in various embodiments of a system or method according to the present disclosure.

FIG. 4 illustrates representative virtual periodic waveforms each having a period of 360 degrees and different amplitudes for use in generating voltages or currents representing digital data in various embodiments of a system or method according to the present disclosure. Waveform 300 corresponds to the VSW of FIG. 3 with an amplitude of 1.0. Waveforms 350, 370, and 390 have the same period and phase, but amplitudes of 0.75, 0.50, and 0.25, respectively. Waveforms 300, 350, 370, and 390 may be used to illustrate determination of voltage/current values used to encode station coordinates of a constellation diagram, such as the constellation diagram of FIG. 1, or the constellation diagram 200 of FIG. 2, for example.

FIGS. 5A-5D illustrate representative arrangements for three-conductor signaling clusters 525 for I/O signaling using multi-phase wired signaling according to various embodiments of the present disclosure. FIG. 5A illustrates a representative embodiment having a signaling cluster 525 with three conductors 510, 520, and 530 in a generally vertical arrangement. Conductors 510, 520, and 530 may be implemented by single or multi-stranded insulated wires, or may be implemented as conductive traces on a circuit board or within an integrated circuit, for example. FIG. 5B illustrates conductors 510, 520, and 530 in a generally planar arrangement positioned between generally parallel planes 550 and 560 of an integrated circuit chip or circuit board layers, for example. As previously described, one or more signaling clusters 525 may be positioned between conductive planes or layers 550, 560 that may be implemented as a voltage plane of generally constant potential, or ground plane, to reduce or eliminate radiated emissions. FIG. 5C illustrates an alternative arrangement of conductors 510, 520, and 530 with a ground conductor 540. FIG. 5D illustrates a similar arrangement of conductors 510, 520, and 530 without a ground wire or conductor. Those of ordinary skill in the art will recognize that the shape, size, and number of conductors may vary depending on the particular application and implementation to provide desired system characteristics. Wires or other conductors may be insulated or otherwise separated from one another and may be generally parallel, or may be twisted with a specified twist ratio. Various embodiments according to the present disclosure use impedance matched conductors to provide desired operating characteristics as described in greater detail herein.

Operation of a representative embodiment of a multi-phase wired signaling strategy having three conductors, such as conductors 510, 520, and 530, is described with reference to FIGS. 2-5. One of the conductors, such as conductor 510 is arbitrarily designated as a base/reference conductor denoted "Q" and is used to transmit voltage/current values generated/determined using a periodic waveform, such as a VSW. In the embodiments illustrated, the "Q" conductor has voltage/current values corresponding to a 0° phase shifted VSW, such as VSW 300. One of the remaining conductors 520 is arbitrarily designated as "R" for purposes of this example, representing the same virtual sine wave 300, but at a location determined by the period/n, where the period is 360°/3 or 120° phase shifted along the wave, which can also be represented by phase shifted VSW 310. The remaining conductor 530 is designated as "S", representing the same virtual sine wave 300, but at a location 240° phase shifted along the waveform, which can also be represented by phase-shifted waveform 320, for example. For printed circuit board (PCB) layouts, the three conductors can be oriented as planar, vertical, or triangle cross-sections, with typical arrangements illustrated in FIGS. 5A-D and described above. Similar to differential pair implementations, controlled impedance and impedance matching across conductors of a signaling cluster is desired to manage radiated emissions, power, and other performance characteristics.

In translating or encoding the constellation stations or coordinates as illustrated in FIG. 2, for example, to voltage/current values to apply to the designated QRS conductors 510, 520, and 530, respectively, a table like the one below may be used. The table values may ultimately be represented or implemented by an appropriate selection of circuit component values and arrangement in the transmit/receive driver circuitry. The table below illustrates representative QRS voltage coding for a voltage-based tri-phase (three conductor) signaling strategy (system or method) with 32 stations or symbols. For each station, the driver circuitry applies voltages associated with the two-dimensional (in this example) coordinates to corresponding QRS conductors in the group or cluster of three conductors representing values of the VSW at appropriate phase offsets. For example, the Q conductor directly encodes the VSW amplitude/phase as a current or voltage value associated with the selected station/symbol in the constellation. The R conductor encodes the VSW amplitude/phase for a position that is phase shifted (advanced or retarded) by 120°. The S conductor encodes the VSW amplitude/phase for a position phase shifted by 120° relative to the Q and R conductors, i.e. retarded by −120° or advanced by 240°.

In operation, each symbol/station 220 includes associated digital data, represented by multiple-bit binary pattern 222, and an assigned two-dimensional coordinate/location <1,0> representing amplitude (1.0) and phase (0°) of a periodic waveform 300 having a period of 360 degrees in this embodiment. As shown in the lookup table below and in FIGS. 3 and 4, the amplitude and phase is converted to a first corresponding voltage (or current) based on the value of the periodic waveform as represented by point 350 and applied to a first conductor 510 (Q). The amplitude and phase is converted to a second corresponding voltage (or current) based on a value of the periodic waveform 300 phase shifted by 120 degrees as represented in the table below and by point 360 of FIG. 3. This voltage (0.866025) is applied to the second conductor 520 (R) by the driver circuitry. The amplitude and phase is converted to a third corresponding voltage (or current) based on a value of the periodic waveform 300 phase shifted by 240 degrees as represented in the table below and by point 370 of FIG. 3. This voltage (−0.866025) is applied to the third conductor 530 (S) by the driver circuitry. As those of ordinary skill in the art will appreciate, the voltages (or currents or powers) are applied to the QRS conductors at substantially the same time, i.e. within a symbol window, as determined to provide appropriate margin for a synchronization clock signal provided to the transmit/receive driver circuitry as previously described.

QRS values for a tri-phase wired 32-symbol constellation as shown in FIG. 2 are represented by the periodic waveforms illustrated in FIG. 4 and listed in the lookup table below. As previously described, the constellation station locations/coordinates may be assigned to achieve particular performance characteristics. However, in this representative embodiment using the constellation diagram 200 of FIG. 2, stations are symmetrically spaced at four substantially equal intervals of +0.25, +0.50, +0.75, and +1.0. This arrangement facilitates scaling to other voltage/current/power ranges appropriate for a particular PCB, IC, or other wired application based on the associated board/chip/system voltage. The stations/symbols are substantially equally spaced around the 360° circle, at 45° intervals in this example, although other arrangements are possibly and within the scope of the invention. This representative arrangement provides eight "radials" and four positions on each radial for a total of 32 stations/symbols in the constellation, for a five-bit coding system using three conductors between transmitting and receiving components. Those of ordinary skill in the art will appreciate that if negative amplitudes are used, the phase coordinates should be selected such that a negative amplitude does not map onto another phase radial that is 180 degrees from the current one. The QRS values listed in the table below are generally illustrated by the periodic waveforms of FIG. 4 with waveform 300 having an amplitude of 1.0, waveform 350 having an amplitude of 0.75, waveform 370 having an amplitude of 0.5, and waveform 390 having an amplitude of 0.25. The QRS values for any amplitude/phase station coordinate/location may be obtained as previously described and illustrated with respect to FIG. 3. As indicated in the table below, the voltages (or currents or powers) associated with each symbol sum to substantially zero.

| Symbol Coordinates | | Data Pattern | Conductor Designation and Value (voltage/current) | | | Differential Values (voltage/current) | | |
|---|---|---|---|---|---|---|---|---|
| Amp | Phase | Bits | Q | R (+120) | S (+240) | Q − R (QR) | S − Q (SQ) | R − S (RS) |
| 0.25 | 0 | 00010 | 0 | 0.216506 | −0.21651 | −0.21651 | −0.21651 | 0.433013 |
| 0.25 | 45 | 00110 | 0.176777 | 0.064705 | −0.24148 | 0.112072 | −0.41826 | 0.306186 |
| 0.25 | 90 | 00111 | 0.25 | −0.125 | −0.125 | 0.375 | −0.375 | 0 |
| 0.25 | 135 | 00101 | 0.176777 | −0.24148 | 0.064705 | 0.418258 | −0.112072 | −0.30619 |
| 0.25 | 180 | 00100 | 0 | −0.21651 | 0.216506 | 0.216506 | 0.21651 | −0.43301 |
| 0.25 | 225 | 00000 | −0.17678 | −0.0647 | 0.241481 | −0.11207 | 0.41826 | −0.30619 |
| 0.25 | 270 | 00001 | −0.25 | 0.125 | 0.125 | −0.375 | 0.375 | 0 |
| 0.25 | 315 | 00011 | −0.17678 | 0.241481 | −0.0647 | −0.41826 | 0.11207 | 0.306186 |
| 0.5 | 0 | 01010 | 0 | 0.433013 | −0.43301 | −0.43301 | −0.433013 | 0.866025 |
| 0.5 | 45 | 01110 | 0.353553 | 0.12941 | −0.48296 | 0.224144 | −0.836516 | 0.612372 |
| 0.5 | 90 | 01111 | 0.5 | −0.25 | −0.25 | 0.75 | −0.75 | 0 |
| 0.5 | 135 | 01101 | 0.353553 | −0.48296 | 0.12941 | 0.836516 | −0.224144 | −0.61237 |
| 0.5 | 180 | 01100 | 0 | −0.43301 | 0.433013 | 0.433013 | 0.43301 | −0.86603 |
| 0.5 | 225 | 01000 | −0.35355 | −0.12941 | 0.482963 | −0.22414 | 0.83652 | −0.61237 |
| 0.5 | 270 | 01001 | −0.5 | 0.25 | 0.25 | −0.75 | 0.75 | 0 |
| 0.5 | 315 | 01011 | −0.35355 | 0.482963 | −0.12941 | −0.83652 | 0.22414 | 0.612372 |
| 0.75 | 0 | 11010 | 0 | 0.649519 | −0.64952 | −0.64952 | −0.649519 | 1.299038 |
| 0.75 | 45 | 11110 | 0.53033 | 0.194114 | −0.72444 | 0.336216 | −1.254774 | 0.918559 |
| 0.75 | 90 | 11111 | 0.75 | −0.375 | −0.375 | 1.125 | −1.125 | 0 |
| 0.75 | 135 | 11101 | 0.53033 | −0.72444 | 0.194114 | 1.254774 | −0.336216 | −0.91856 |
| 0.75 | 180 | 11100 | 0 | −0.64952 | 0.649519 | 0.649519 | 0.64952 | −1.29904 |
| 0.75 | 225 | 11000 | −0.53033 | −0.19411 | 0.724444 | −0.33622 | 1.25477 | −0.91856 |
| 0.75 | 270 | 11001 | −0.75 | 0.375 | 0.375 | −1.125 | 1.125 | 0 |
| 0.75 | 315 | 11011 | −0.53033 | 0.724444 | −0.19411 | −1.25477 | 0.33622 | 0.918559 |
| 1 | 0 | 10010 | 0 | 0.866025 | −0.86603 | −0.86603 | −0.866025 | 1.732051 |
| 1 | 45 | 10110 | 0.707107 | 0.258819 | −0.96593 | 0.448288 | −1.673033 | 1.224745 |
| 1 | 90 | 10111 | 1 | −0.5 | −0.5 | 1.5 | −1.5 | 0 |
| 1 | 135 | 10101 | 0.707107 | −0.96593 | 0.258819 | 1.673033 | −0.448288 | −1.22474 |
| 1 | 180 | 11101 | 0 | −0.86603 | 0.866025 | 0.866025 | 0.86603 | −1.73205 |
| 1 | 225 | 10000 | −0.70711 | −0.25882 | 0.965926 | −0.44829 | 1.67303 | −1.22474 |
| 1 | 270 | 10001 | −1 | 0.5 | 0.5 | −1.5 | 1.5 | 0 |
| 1 | 315 | 10011 | −0.70711 | 0.965926 | −0.25882 | −1.67303 | 0.44829 | 1.224745 |

As previously described, the phase arrangement for any given constellation can be arranged to provide desired separation and associated detectability for a particular application or implementation. Those of ordinary skill in the art may recognize that the multi-phase signaling strategy described above may facilitate auto-alignment of voltages between transmitters and receivers. For example, if a transmitter were sending to a receiver where only the ground is shared, the receiver could auto-align by determining the absolute min/max voltages on the Q wire and using those to scale the R & S wires to recover the constellation. In addition, because the signaling strategy is modeled after the ubiquitous tri-phase power transmission system, the steadystate power at every station is nearly identical for a particular amplitude if the design has controlled impedance when amplitude represents power.

The multi-phase signaling strategy according to various embodiments of the present disclosure provides a number of advantages. For example, while a transition from one station/symbol to another station may produce little or no voltage/current/power change in one wire of the signaling cluster, one or more of the other wires experiences a larger-range digital-like voltage/current/power swing, which improves noise margin and reduces bit error rate. In addition, external transients tend to couple equally onto all wires of a signaling cluster, which still permits decoding a station and associated digital data based on the relative values between the various wires rather than absolute individual values. Using the differential voltage/current values between pairs of conductors within a signaling cluster also provides common-mode noise rejection while still providing a good set of detection values as demonstrated by the examples below. Furthermore, because the positions/locations/coordinates of the stations in the constellation are arbitrary, they may be positioned to achieve specified voltage/current ratios that are easier to generate and decode, rather than using forced equal spacing. In addition, the nearly identical power-per-station for a given amplitude, indicates that the signaling strategy may be able to achieve constant power during transitions, achieving a digital transmission system with near zero switching emissions.

Those of ordinary skill in the art will appreciate that traditional system analysis tools, such as the "eye diagram" associated with differential pairs may no longer be directly available. Furthermore, many possible encodings exist where no station/symbol has the full amplitude value. However, as long as the QRS stream visits each station with substantially the same probability, recovery of the constellation and the associated digital data is possible even with severe signal drop down a transmission line, similar to the manner used in conventional RF N-QAM systems.

Transmission-Side Implementation for Multi-Phase Wired Signaling

Figure 6:
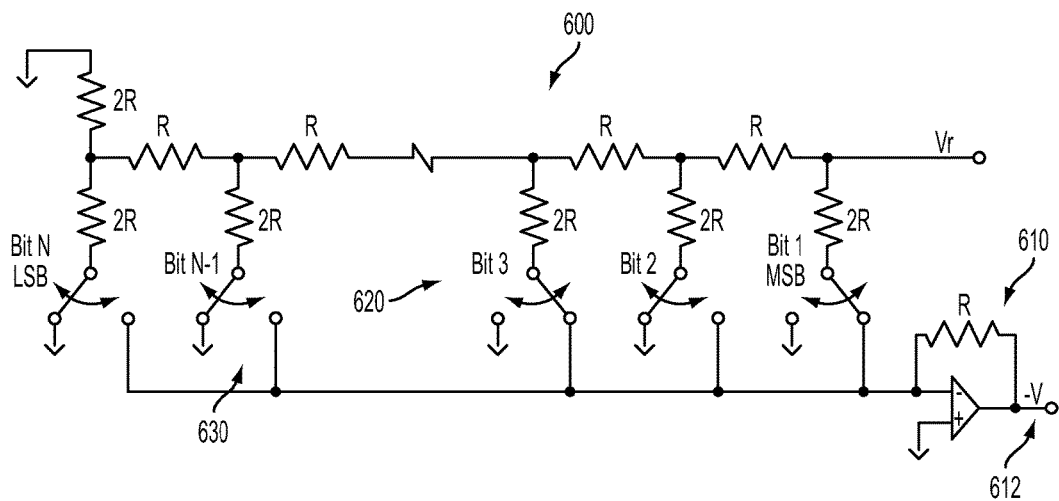
FIG. 6 is a diagram illustrating a representative embodiment of a transmission device including circuitry for multi-phase wired signaling according to the present disclosure.

FIG. 6 is a diagram illustrating a representative embodiment of circuitry for a transmission device for use in multi-phase wired signaling according to the present disclosure. Circuitry 600 implements a standard R-2R constant-current switch ladder to generate a corresponding voltage which is applied to one of the signaling conductors through a precision voltage follower/inverter. In the representative embodiment of a transmission device illustrated in FIG. 6, $V_r$ is connected to an internal reference voltage, and the voltage follower/inverter 610 directly drives the associated conductor 612 by applying the corresponding voltage to the conductor. A look-up table or similar device drives the switching bits 620 to select the voltage appropriate for the QRS wire being driven as previously described. One advantage of an R-2R ladder as illustrated in FIG. 6 is that the various switches 630 controlled by bits 620 can be implemented as make-before-break switches (e.g. MAX4625 analog switches available in 6-pin packages from Maxim, Sunnyvale, Calif.) which allows constant current flow without switching transients at the driving side.

Those of ordinary skill in the art will recognize that the switching bits 620 are selected to generate a suitable number of voltages as required by the number of symbols and the constellation coordinate assignments. For example, if using the table above in a 32-symbol system, Vr would be connected to +1, and the number of switching bits 620 would be selected to give reasonable approximations of the different Q, R, and S values from the table. As previously, described, the representative embodiment illustrated facilitates scaling to various system voltages.

Figure 7:
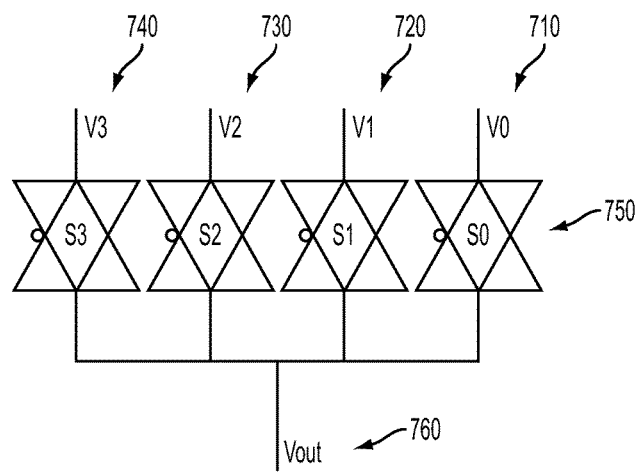
FIG. 7 illustrates another representative embodiment of a transmission device using CMOS transmission gates for multi-phase wired signaling according to the present disclosure.

FIG. 7 illustrates another representative embodiment of circuitry for a transmission device using CMOS transmission gates for multi-phase wired signaling according to the present disclosure. In the embodiment illustrated in FIG. 7, fixed voltage sources 710, 720, 730, and 740 are selectively switched by CMOS transmission gates 750 to select the appropriate voltage source and apply the corresponding voltage to conductor 760. As such, voltages represented by V0 . . . V3 (readily extended to an arbitrary number of voltages) corresponding to the Q, R, or S values previously described are connected to a respective CMOS transmission gate S0 . . . S3. The desired voltage may be selected by using a decoder to select one specific transmission gate to enable. A design such as this one would internally generate a voltage reference tree that contains all of the required voltages in the Q, R, and S columns in the table above.

The representative implementations of FIG. 6 and FIG. 7 permit reasonable accuracy in generating a corresponding voltage, $V_{out}$, for driving each of the Q, R, and S conductors. Of course, those of ordinary skill in the art may recognize various other implementations to apply a selected voltage to the conductors in a signaling cluster consistent with the present disclosure.

In operation, the circuitry illustrated in the embodiments of either FIG. 6 or FIG. 7 may be used to convert a first amplitude and phase of a periodic waveform to a first corresponding voltage and apply the first corresponding voltage to a first at least one of the plurality of conductors in a signaling cluster. Similarly circuitry may be used to drive each of the "n" conductors in a signaling cluster such that each stage or section is associated with a particular conductor and operates to convert the first amplitude and first phase to a corresponding voltage based on the amplitude of the periodic waveform phase shifted by m*period/n degrees relative to the first phase, where m is indexed from one to (n−1).

As previously described, each conductor in the group of conductors of a signaling cluster may be implemented by two conductors of a differential pair. As such, a voltage (or current) determined for the first conductor would be applied to Q, for example, with the inverse voltage (or current) applied to a second conductor Q'. Similarly, the voltage (or current) determined for each of the remaining n−1 conductors along with an associated inverse voltage (or current) would be applied to a corresponding pair of conductors. While this implementation requires twice as many conductors, it still reduces the number of conductors required relative to various conventional signaling strategies. In addition, this implementation facilitates use of signaling strategies according to the present disclosure with existing networking infrastructure, such as used in Ethernet applications, for example.

Receive-Side Implementation for Multi-Phase Wired Signaling

Figure 8:
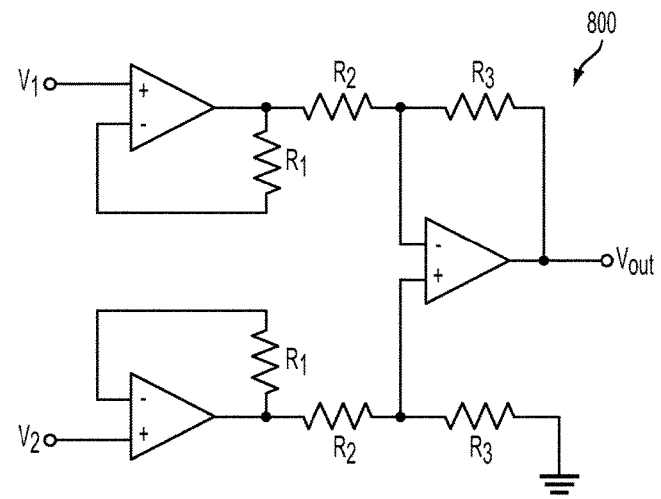
FIG. 8 is a diagram illustrating a representative embodiment of circuitry for generating a differential voltage in a receiver/detector device for multi-phase wired signaling according to the present disclosure.

FIG. 8 is a diagram illustrating a representative embodiment of a receiver/detector device including circuitry for multi-phase wired signaling according to the present disclosure. Those of ordinary skill in the art will recognize that there are many possible strategies for decoding specific voltages or currents on the conductors within a signaling cluster according to the present disclosure. For example, high-impedance comparators can be used to quickly determine an approximate voltage/current of an associated conductor. A precise determination of the voltage/current is generally not required in a digital signaling strategy as disclosed here. Another approach would use low-bit flash analog-to-digital (ADC) convertors to quickly determine the voltage/current values. While comparing each conductor independently to a series of references/thresholds may also be suitable in a limited number of applications, this approach is more susceptible to common-mode noise spikes coupled onto the conductors. As such, various embodiments according to the present disclosure use a differential voltage/current comparison of one or more pairs of conductors within a signaling cluster to multiple thresholds/reference values.

FIG. 8 illustrates one embodiment of circuitry for a receiving device that may be used to generate a differential voltage between a pair of conductors of a signaling cluster. Circuitry 800 operates as a differential amplifier or differential voltage follower when resistor values for $R_1$, $R_2$, and $R_3$ are substantially identical. A tri-phase wired signaling system as described above would include three such differential amplifiers 800 to generate the differences for QR, RS, and SQ pairs. For example, in the first amplifier, conductor Q connects to $V_2$ and conductor R to $V_1$ such that $V_{out}$ generates the differential voltage values in the QR column of the above table. In the second amplifier, conductor S connects to $V_2$ and conductor Q connects to $V_1$, such that $V_{out}$ produces the differential voltage values in the SQ column of the above table. In the third amplifier, conductor R connects to $V_2$ and conductor S connects to $V_1$, such that $V_{out}$ produces the differential voltage values in the RS column of the above table. Note that QR, RS, and SQ also sum to zero. Any deviation from zero indicates errors in one or more of Q, R, S, and can be used to adjust calibration for robustness.

The differential voltage values of the QR, SQ, and RS columns in the above table may be used to determine comparator values which can uniquely identify a bit encoding based on the values from the three differential amplifiers. For example, in the embodiment illustrated in the table of FIG. 10, the following 24 reference/threshold comparator voltages are selected: −1.7, −1.55, −1.4, −1.25, −1.1, −0.95, −0.8, −0.65, −0.5, −0.35, −0.2, −0.05, 0.05, 0.2, 0.35, 0.5, 0.65, 0.8, 0.95, 1.1, 1.25, 1.4, 1.55, and 1.7.

Figure 9:
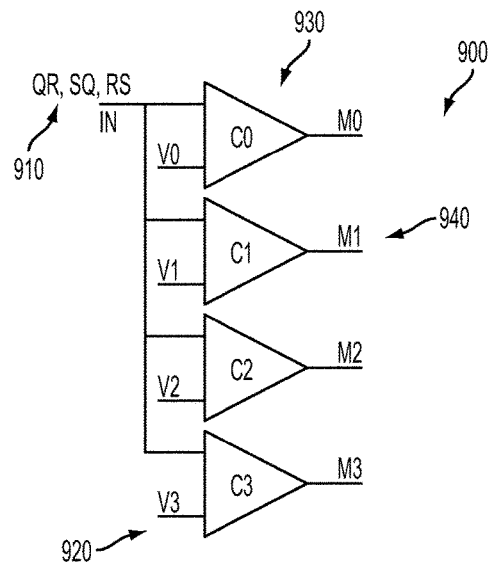
FIG. 9 is a diagram illustrating a representative embodiment of circuitry for comparing voltages to a plurality of thresholds and generating a binary match pattern for a receiver/detector device for multi-phase wired signaling according to the present disclosure.

FIG. 9 is a diagram illustrating a representative embodiment of circuitry for comparing differential voltages to a plurality of thresholds and generating a binary match pattern for a receiver/detector device for multi-phase wired signaling according to the present disclosure. Circuitry 900 includes a bank of comparators 930 that operates to compare the differential voltages or currents between at least one pair of conductors within a signaling group. In this example, differential voltages associated with the first and second conductors (QR), third and first conductors (SQ), and second and third conductors (RS) are compared to associated reference values or thresholds 920 to generate match bits 940 that form a binary match pattern used to decode the digital data. Match bits 940 (M0 . . . M3) create a digital representation or estimate of the value on the given differential output. In general, it is possible to obtain a unique set of detection values or match pattern using less than the number of symbols of the signaling strategy. Stated differently, detection can be accomplished with a number of thresholds or comparators that is less than the number of permutations of the multiple-bit binary pattern. In the representative embodiment described above, the five-bit binary pattern includes 32 permutations or symbols that are detected using 24 reference/threshold comparators, although a smaller or better optimized number may be possible depending on the particular application and implementation.

Although one bank of comparators 930 having four comparators is illustrated in FIG. 9, actual implementations may include a dedicated bank of comparators 930 for each pair of conductors of the signaling cluster or group that are used in a particular application, with each bank having a number of comparators less than the number of symbols in the signaling strategy. The number of pairs of conductors used may be selected to achieve desired performance characteristics for a particular application or implementation. For example, as described and illustrated in greater detail with respect to one representative embodiment below, a four-conductor signaling cluster provides six available pairs with only four of the pairs selected.

In a representative tri-phase signaling strategy with three signaling conductors, a separate bank of comparators 930 may be provided for each differential voltage pair 910 corresponding to the differential voltages QR, SQ, and RS. Similarly, comparator bank 930 would include a comparator for each selected threshold or reference voltage 920. In this example, a bank of 24 comparators would be used, only four of which are illustrated in FIG. 9. Each comparator 930 compares the voltage (QR, SQ, or RS) on one input to an associated threshold (V0-V3) to generate a corresponding match bit (M0-M3) when the input voltage exceeds the threshold. The match bits 940 create a match pattern or match set as illustrated in the table above. As such, circuitry as illustrated in FIG. 9 can be used to generate a binary match pattern for each selected pair of conductors with each bit of the binary match pattern associated with one of the plurality of thresholds 920. The binary match pattern is then used to determine the corresponding digital data or unique multiple-bit binary pattern. In one embodiment, the maximum and minimum number of asserted bits in the binary match pattern of all of the pairs of the conductors may be used to determine the corresponding digital data, although other techniques may also be used as described in greater detail below.

FIGS. 10A-10C illustrate operation of a system or method for decoding data in response to received differential voltages/currents in a poly-phase wired signaling strategy having three signaling lines according to various embodiments of the present disclosure. As previously described, each signaling line may be implemented by a single conductor, or may be implemented by two conductors operating as a differential pair. In the latter case, a first conductor of the differential pair has a voltage/current as shown in the table, and the second conductor has the inverse voltage/current.

The values in this example correspond to a 32-symbol signaling strategy similar to the embodiment previously described. However, the constellation diagram used in the present example has symbol location/coordinates beginning at a phase of 30° and generally equally spaced at 45° intervals, which results in phases of 30°, 75°, 120°, 165°, 210°, 255°, 300°, and 345°. In addition, rather than 24 comparator voltages or thresholds, only 12 detection thresholds are used in corresponding banks of 12 comparators for each of the differential selected voltage pairs QR, SQ, and RS. In this representative embodiment, comparator voltage thresholds are: −1.4, −1.18, −1, −0.55, −0.28, −0.05, 0.05, 0.28, 0.55, 1, 1.18, and 1.4. This design results in similar robustness as the embodiment previously described, but reduces the receive-side circuitry by about one-half.

As with the previously described embodiment, this embodiment associates digital data represented by the data bits in the table below with corresponding unique two-dimensional coordinates representing amplitude and phase of a periodic waveform having a period of 360 degrees. The amplitude and phase are converted to a first corresponding voltage and applied to a first signaling line, corresponding to a first conductor or differential pair (Q) as shown in the table of FIG. 10A. Similarly, the amplitude and phase are converted to a second corresponding voltage based on a value of the periodic waveform phase shifted by 120 degrees relative to the amplitude and phase, with the second voltage applied to a second signaling line implemented by a conductor or differential pair of conductors (R) as shown in the corresponding column labeled "R(+120)". Likewise, the amplitude and phase are converted to a third corresponding voltage based on a value of the periodic waveform phase shifted by 240 degrees (or −120 degrees) relative to the amplitude and phase and applied to a third signaling line implemented by a conductor or differential pair (S) as represented by the values in the column labeled "S(−120)". As illustrated by the table of FIG. 10A, the first, second, and third voltages for a particular symbol sum to substantially zero. The differential voltages for each pair of signaling lines (QR, SQ, and RS) is compared to a plurality of thresholds, (12 in this example) to decode the associated digital data word in the column labeled "Bits" of FIG. 10B. As indicated in the table, the digital data comprises a multiple-bit binary word having "n" bits (5 in this example) and the number of thresholds (12) is less than $2^{11}$ or 32.

FIG. 10B illustrates operation of three banks of 12 comparators each used to generate match patterns and decode the associated multiple-bit data words. The values from the bank of comparators 930 at the receiver attached to the QR differential voltage (or current) are represented by the match pattern in the column labeled "QR Match Set." Similarly, the values for the comparators attached to the SQ differential voltage (or current) are represented by the match pattern data in the column labeled "SQ Match Set." Likewise, the values for the comparators attached to the RS differential voltage (or current) are represented by the match pattern data in the column labeled "RS Match Set." Each of the match patterns in the "Match Set" columns includes asserted bits, represented by 1's in this embodiment, and/or non-asserted bits, represented by 0's in this embodiment, based on the asserted match bits 940 for the thresholds or voltages exceeded or "matched" by the differential voltage associated with a particular received symbol/coordinate. Values in the column labeled "qr1" represent the number of asserted bits or 1's in the QR match set. Values in the column labeled "sq1" represent the number of asserted bits or 1's in the SQ match set. Values in the column labeled "rs1" represent the number of asserted bits or 1's in the RS match set. Values in the column labeled "Max" represent the maximum number of asserted match bits (1's in this example, although the inverse logic is equally applicable) across all of the selected pairs of conductors, QR, SQ, and RS in this example. Similarly, values in the column labeled "Min" represent the minimum number of asserted match bits (1's) for all of the selected pairs of signaling lines (single conductors or differential pairs) in the signaling group or cluster. The table of FIG. 10C provides a sorted list of values for qr1, sq1, and rs1.

As illustrated in the tables of FIGS. 10A-10C, the n-tuple or triplets formed by <qr1,sq1,rs1> entries are unique across all 32 rows. This permits directly mapping to a specific bit pattern or data word when decoding the received signal based on the number of asserted (or non-asserted) bits in the match pattern. Alternatively, the maximum and minimum number of asserted (or non-asserted) bits may be used to decode the received signal. While there are multiple rows where the same Max/Min values exist, there is always a unique triplet or n-tuple representing the number of asserted bits in each match pattern associated with a signaling line pair that may be used to uniquely identify the associated bit pattern or data word for the otherwise ambiguous Max/Min combinations. As such, Max/Min values may be used in combination with the number of asserted (or non-asserted) bits to decode the signal and uniquely identify an associated bit pattern or data word. Of course, the comparator thresholds and/or number of thresholds may also be selected such that the Max/Min n-tuple or pairings are unique across all symbols, if desired, such that Max/Min could be used to uniquely identify a particular data word or bit pattern.

As also illustrated in the table of FIG. 10B, the column labeled "Del+" includes values analogous to conventional "eye" spacing for detection of the given row using the difference between the maximal 1's span and the minimal 1's span for that row. The spacing is based on the average spacing of the selected comparator voltages/thresholds, which in this example are approximately 0.15 volt per comparator. Similarly, the column labeled "Del−" includes values analogous to the "eye" spacing if the maximal span is just over the last '1' comparator detection threshold, while the minimal span is just under the first '0' comparator threshold, which reduces the "eye" by about 0.15 in this example. As illustrated in the table of FIG. 10B, for this example, there is at least 0.15 volt separation for the worst case "eye" values and typically 0.3 volt separation, which is readily detectable in a digital system using common-mode noise rejection as in this approach.

A 2-Bit-Per-Transition Tri-Phase Example

In another embodiment of a wired 4-symbol multi-phase signaling strategy, a simpler design achieves 2-bits-per-transition in a constant amplitude four-station strategy. A periodic waveform implemented by a VSW having an amplitude of unity and phases of 0°, 90°, 180°, and 270° may be used to generate the voltages and bit encodings as illustrated in the following table.

| Amp | Phase | Encoding | Q | R (+120) | S (−120) | R − Q (QR) | S − Q (SQ) | R − S (RS) |
| --- | --- | --- | --- | --- | --- | --- | --- | --- |
| 1 | 0 | 00 | 0.000 | 0.866 | −0.866 | −0.866 | −0.866 | 1.732 |
| 1 | 90 | 01 | 1.000 | −0.500 | −0.500 | 1.500 | −1.500 | 0.000 |
| 1 | 180 | 10 | 0.000 | −0.866 | 0.866 | 0.866 | 0.866 | −1.732 |
| 1 | 270 | 11 | −1.000 | 0.500 | 0.500 | −1.500 | 1.500 | 0.000 |

From this table it can be readily seen that using three wires and four states, it is trivial to decode each of the four states, with significant noise margin from state to state and also within a given state. When the RS differential voltage is zero (for encodings/digital data of 01 and 11), for example, the QR and SQ differential voltages readily distinguish between the two and eliminate any ambiguity.

This simple encoding is readily implemented in both the transmit device and the receive device, and eliminates a wire/conductor compared to a conventional 2-bit differential pair system. Furthermore, this embodiment retains the constant-power-per-bit and noise immunity of a conventional differential pair system, while reducing the number of conductors by 25%. Because the I/O is generally the limiting factor in modern high-speed designs, the moderate additional circuitry to encode and decode the data using this signaling strategy will be more than offset by the savings in chip area required for I/O bond-pads and wire connections in many applications.

A 5-Bit-Per-Transition Quad-Phase Example

A common wiring system known as "Star-Quad" consists of a twisted quartet of wires. Another embodiment of the present invention can be used over such wiring to achieve significant bandwidth improvement over an equivalent wiring of two twisted pairs carrying two standard differential binary signals. Operation of this embodiment is illustrated and described with reference to FIGS. 11A-11C. In this embodiment, a 32-symbol constellation diagram is used with each station assigned one of four amplitudes of 0.25, 0.5, 0.75, and 1.0 and one of eight phases corresponding to radials spaced at thirty degrees as in the previous embodiment. Encoding is performed using four virtual periodic waveforms each having different amplitudes, which correspond to the amplitudes used in the constellation diagram in this example, but may be assigned or scaled based on the system voltage/current levels as previously described. The virtual periodic waveforms are then used to determine a corresponding voltage (or current) to be applied to an associated signaling line, which may be implemented by a single conductor or by a differential pair as previously described. Each voltage (or current) value is determined based on the value of the periodic waveform at a reference point, and then phase shifted by +90 degrees (R), +180 degrees (S), and −90 degrees (T) analogous to the previously described embodiments. The four signaling lines (Q, R, S, and T) are used to generate four differential values (QR, RS, ST, and TQ) corresponding to at least one selected signaling line pair. Those of ordinary skill in the art will recognize that the four signaling lines (Q, R, S, and T) have six available signaling line pairs (QR, QS, QT, RS, RT, and ST). One or more signaling line pairs may be selected for use in generating the differential values depending on the particular application and implementation.

In the representative embodiment illustrated in FIGS. 11A-11C, comparator values/voltages of −1.4, −1.18, −1.0, −0.7, −0.4, −0.1, 0.1, 0.4, 0.7, 1.0, 1.18, and 1.4 result in the match pattern data represented by the match sets illustrated in FIG. 11B. Analogous to the three-wire embodiment, the sum of QR, RS, ST, and TQ is zero, and the 4-tuple or quartet <qr1,rs1,st1,tq1> is unique for each bit encoding as illustrated by the sorted table entries of FIG. 11C. Using the same number of wires as two differential pairs, five bits are transmitted in the same amount of time as two bits with conventional differential signaling.

Figure 12:
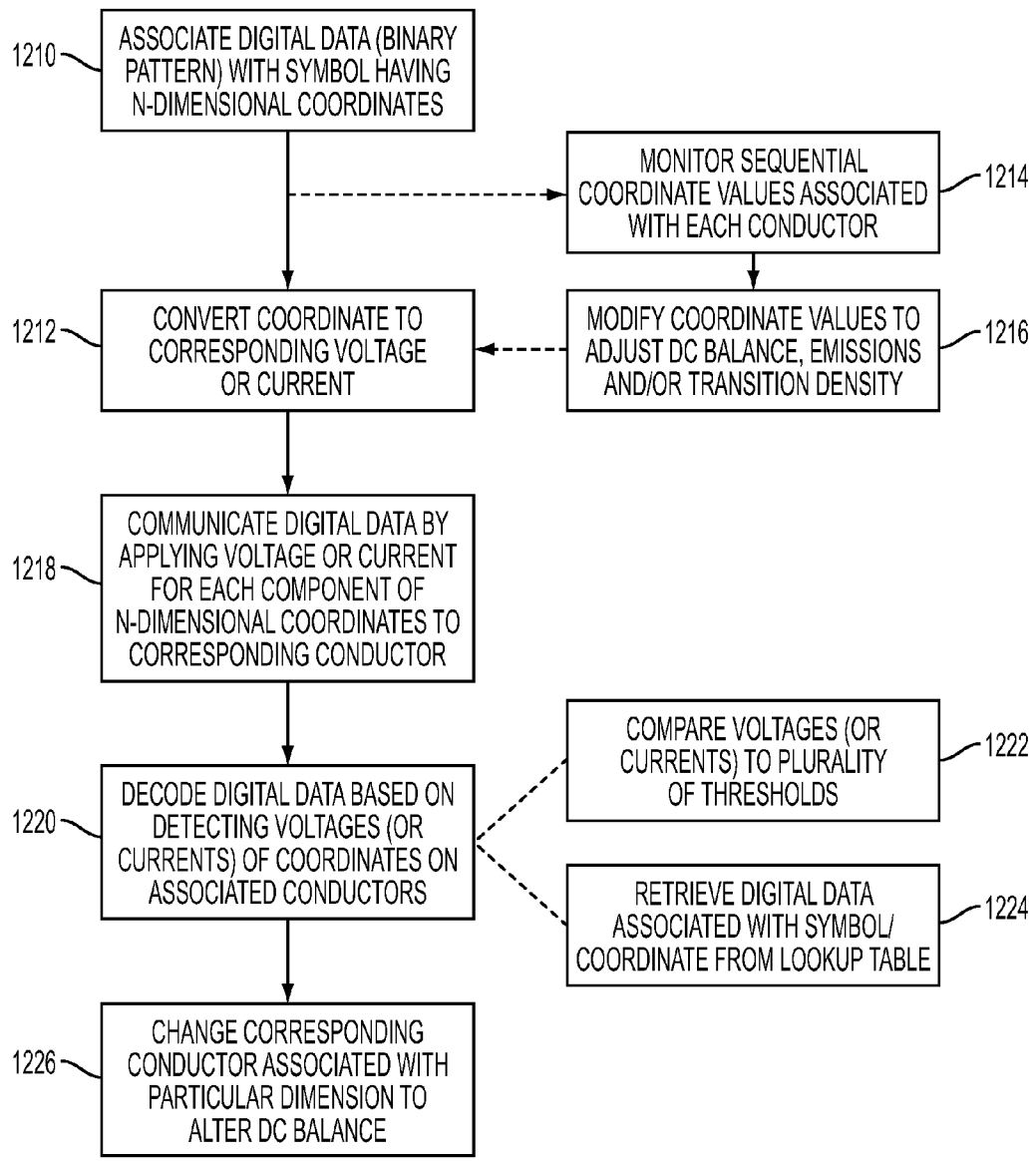
FIGS. 12 and 13 are diagrams illustrating operation of various representative embodiments of a system or method for digital signaling according to the present disclosure.
Figure 13:
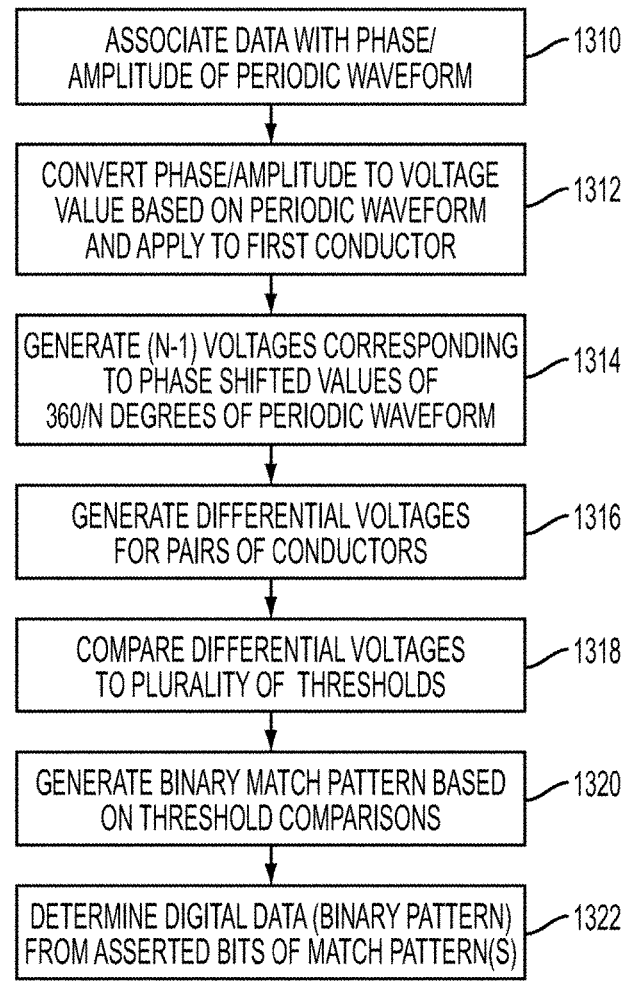

FIGS. 12 and 13 are diagrams illustrating operation of various representative embodiments of a system or method for digital signaling according to the present disclosure. Those of ordinary skill in the art will recognize that the functions represented in the diagrams may be performed by various types of devices, including software, firmware, and/or hardware devices. Depending upon the particular application and implementation, various functions may be performed by circuitry implemented using discrete components and/or integrated circuit components. As such, the various functions may be performed in an order or sequence other than illustrated in the Figures. Similarly, one or more steps or functions may be repeatedly performed, or omitted, although not explicitly illustrated. As previously described, reference to a conductor should be understood to include a signaling line that may be implemented by a single conductor, or by a pair of conductors functioning as a differential signaling pair.

As generally represented by block 1210, a system or method for multi-phase digital signaling includes associating digital data (represented by a unique multiple-bit binary pattern, for example) with corresponding unique n-dimensional coordinates for each of a plurality of binary patterns. The coordinates may represent selected or assigned symbol locations of a constellation diagram, for example. In one embodiment, associating digital data includes assigning n-dimensional coordinates that maximize distance between adjacent pattern coordinates within an associated voltage or current range of the integrated circuit chip. The system or method includes converting each coordinate of the n-dimensional coordinates to a corresponding voltage or current as represented by block 1212. The system or method may optionally include monitoring a series of sequential coordinate values associated with each conductor as represented by block 1214 and modifying the coordinate values to adjust at least one of DC balance, radiated emissions, and transition density associated with the series of sequential coordinate values before converting each coordinate to a corresponding voltage or current as generally represented by block 1216. Modifying the coordinate values may include encoding a stream of coordinates associated with each signaling line using a line code before converting the coordinates to corresponding voltages or currents.

As also shown in FIG. 12, the system or method include communicating the multiple-bit binary pattern by applying each voltage or current associated with the n-dimensional coordinates to a corresponding conductor of a group of "n" conductors, wherein the number "n" of conductors is less than the number of bits of each multiple-bit binary pattern, as generally represented by block 1218. As represented by block 1220, the system or method include decoding the multiple-bit binary pattern associated with the n-dimensional coordinates based on detecting the voltages or currents of the "n" conductors. Decoding the digital data may optionally include comparing the voltages or currents to a plurality of thresholds to determine a corresponding coordinate value as represented by block 1222. Likewise, decoding the digital data may optionally include using the n-dimensional coordinates to retrieve an associated unique multiple-bit pattern from a lookup table as represented by block 1224. The system or method may also include changing the corresponding conductor associated with a particular dimension of the n-dimensional coordinates to alter DC balance across the group of "n" conductors as represented by block 1226.

As illustrated in the diagram of FIG. 13, in one embodiment a system or method for multi-phase signaling includes associating digital data with corresponding n-dimensional coordinates or locations wherein the n-dimensional coordinates are two-dimensional coordinates representing amplitude and phase of a periodic waveform as generally represented by block 1310. As previously described, the amplitude and phase coordinates are converted to a first voltage or current that is applied to a first signaling conductor as represented by block 1312. The system or method then includes generating (n−1) voltages or currents each corresponding to values of the periodic waveform at phases of about 360/n degree intervals as represented by block 1314. As those of ordinary skill in the art will recognize, the first and (n−1) voltages or currents are applied substantially simultaneously to corresponding conductors for each symbol to transmit or communicate the digital data.

Detection and decoding of transmitted digital data begins by generating differential voltages or currents for at least one pair of the conductors as represented by block 1316. The system or method continue by comparing each differential voltage or current to a plurality of thresholds to select the corresponding unique multiple-bit binary pattern (digital data) as represented by block 1318. In one embodiment, the number of thresholds is less than the number of permutations of the multiple-bit binary pattern, i.e. for a 4-bit binary pattern the number of thresholds would be less than 16.

As also shown in the diagram of FIG. 13, detecting the transmitted n-dimensional coordinates and associated digital data may include generating a binary match pattern for each of the at least one selected pair of the conductors with each bit of the binary match pattern associated with one of the plurality of thresholds as represented by block 1320. The system or method may also include determining a corresponding unique multiple-bit binary pattern (digital data) based on a number of asserted bits in the binary match patterns of all of the selected pairs of the conductors as represented by block 1322. In one embodiment, the maximum and minimum numbers of asserted bits associated with the selected pairs of conductors within a particular symbol period are used to determine a corresponding digital data word. Alternatively, the number of asserted bits in match patterns associated with each selected pair is used to differentiate between otherwise ambiguous maximum/minimum values. This may include accessing a look-up table indexed by the number of asserted bits and/or the maximum and minimum number of asserted bits with the output corresponding to the associated digital data (unique multiple-bit pattern).

Those of ordinary skill in the art will recognize that the embodiments of the present disclosure demonstrate that the multi-phase signaling strategy described, with little or no optimization, provides a robust mechanism for decoding five bits or two bits per transition over three conductors. This provides a significant improvement relative to conventional differential pair signaling. For example, in a conventional different pair strategy with a single bit per transition, six conductors are used to transmit three bits per transition. In contrast, using a multi-phase signaling strategy according to the present disclosure enables transfer of ten data bits per transition in a five-bit-per-symbol implementation, or four data bits per transition in a two-bit-per-symbol design, for a bit density increase of over 300% in the five-bit strategy and a bit density increase of 33% in the two-bit strategy. This comes at the expense of a moderate amount of additional circuitry for encoding and decoding.

For IC chip implementations, every differential pair already has effectively a driver per I/O conductor. For the multi-phase signaling embodiments described above, the resistors needed to form the R-2R ladder switches, or to create the desired voltage values for the CMOS pass-gate implementation require very little area. Pass-gates are similarly small, low-current devices, so there is minimal impact on the transmit side.

On the receive side, the representative example uses one differential amplifier per conductor pair, which is analogous to the differential receiver in a conventional differential pair signaling strategy. As such, the representative embodiments of a signaling strategy according to the present disclosure result in a 50% increase in the number of amplifiers. For example, in the six-wire comparison described above, nine amplifiers would be used in the multi-phase signaling strategy with one amplifier for each pair of conductors as compared to only six for a conventional differential pair strategy. This would require about 50% more IC chip area to accommodate the additional amplifiers.

The bank of comparators associated with each differential amplifier is unique to the multi-phase signaling embodiments. In addition, the binary match sets may use a simple look-up table or other device with 32 entries to provide the 32-to-5 bit lookup symbol decoding function and identify the corresponding five-bit digital data value. However, all of this circuitry is fast and small and should not be a significant deterrent to widespread adoption. Furthermore, optimization of the threshold match voltages can produce a design that uses significantly fewer comparators.

In an alternative embodiment suitable for applications where more noise or EM interference is present, the direct-match function of the comparators and pattern matching bits can be replaced by a statistical similarity match similar to PRML (Partial Response Maximum Likelihood) techniques to extract the most probable symbol and associated 5-bit data, for example.

The resulting design with the five-bit-per-transition approach provides a system which is capable of matching existing differential-pair transmission speeds, but provides over three times the number of bits per I/O pad on an integrated circuit. With the two-bit-per-transition approach, a 33% increase is achieved.

With a small amount of rework, a 10 gigibit-per-second design becomes a 50 gigibit-per-second design at the same clock speeds. A gigabit Ethernet readily becomes a five gigabit network.

A 15-bit differential bus, with 30 wires, capable of transferring 15 bits per transition using conventional differential signaling, becomes a set of 10 tri-phase signaling groups or clusters (30 wires), each transferring five bits in this example, resulting in a capacity of fifty bits per transition. Conversely, the same 15-bit bus with 30 wires could be replaced with three tri-phase groups requiring only nine wires for 15 bits instead of the thirty required for differential signaling, such that the remaining 21 wires and I/O pads are available to expand the chip design. Furthermore, with additional precision on the voltages and the decoding, the constellation size could readily be increased beyond the demonstrated 32 stations.

Tri-phase wired signaling according to the present disclosure retains many of the advantages associated with conventional differential pair signaling, such as constant power (for a given amplitude), for example. In addition, a driving amplifier design that preserves constant power across amplitude changes can be created, providing a significant reduction in switching transients associated with data transfer from one integrated circuit to another. Backplanes and card connectors, also a bottleneck source, could be redesigned to use wire triplets, with either significant reduction in connector pin count, significant increase in bandwidth over the same size connector, or a combination of both.

Those of ordinary skill in the art will recognize that use of multi-phase wired signaling according to the present disclosure at slower switching speeds, with each wire representing one dimension in an N-dimensional constellation, and each dimension represented by K values, an N-wire system can carry $K^N$ values instead of $2^N$ values provided by existing digital systems. If K is eight ($2^3$), for example, the N-wire capacity becomes $2^{3N}$ on the same N-wire bus. An 8-wire bus can now carry $2^{24}$ values instead of only $2^8$. Existing differential-pair style connectors and backplanes can still be used, with slower switching speeds due to the increased bit carrying capacity over the same conductors. A 10 gigabit design requiring a 64-bit bus clocked at 156.25 MHz could be redesigned with K=8 and a voltage range of +2 to −2V (2.0, 1.43, 0.857, 0.286, −0.286, −0.857, −1.43, −2.0) so that each pair carries three bits per transition instead of a single bit. The same 10 gigabit rate could be achieved with either ⅓ of the wires at the same clock rate, or the same number of wires could be used and the clock rate reduced by ⅓ to about 53 MHz, significantly reducing radiated emissions.

Relative Magnitude Based Encode/Decode

Various embodiments for digital signaling or storage according to the present disclosure provide encoding and decoding of the constellation stations that can significantly reduce the number of comparators required to decode a given station.

Figure 14:
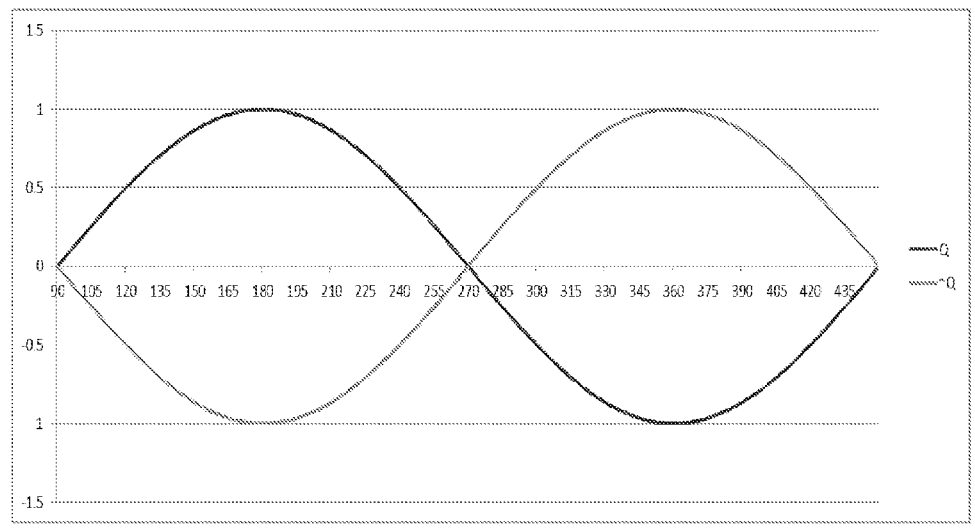
FIG. 14 illustrates representative voltages/currents carried on a differential pair through one complete cycle of 360 degrees of one embodiment for digital signaling or storage according to various embodiments of the present disclosure.

FIG. 14 is a representative graph illustrating possible sets of voltages/currents carried on a differential pair through one complete cycle of 360 degrees. Note that the graph starts at 90 degrees and runs through 450 degrees simply because the optimization analysis was using cosine of theta, and it is more convenient to show the partitions used for encoding/decoding based on relative magnitudes of the signals when Q and ~Q start with a zero-crossing. In the representative embodiment illustrated, the two conductors are labeled "Q" and "~Q". The two signals are substantially equal in magnitude but opposite in polarity about zero. When one is positive, the other is negative, and vice versa.

As illustrated in the graph of FIG. 14, there are essentially two "partitions" (sometimes referred to as 'eyes' based on the graph's resemblance to a pair of eyes or glasses) in the differential signaling system, the first when "Q>~Q", and the second when "~Q>Q". For a two-state (one bit) system the left "eye" represents a 1 and the right "eye" represents a 0. With differential pairs, the more "open" the eye, the better the noise immunity and the more robust the signal.

With 5-PAM signaling, such as used in gigabit Ethernet, the eyes have five states, defined by the value of the Q wire: −2, −1, 0, 1, and 2. This corresponds to the eyes being full-open, half-open, or closed. These states are generally straight-forward and fairly easy to decode.

Using more bits per symbol according to various embodiments of the present disclosure introduces more levels or states and quickly becomes very difficult to distinguish between different "amounts of openness" of the right or left eye. To send four bits-per-symbol, for example, sixteen unique "amounts of openness" must be defined, and distinguishing between "right-eye-⅛-open" versus "both-eyes-closed" is difficult without precision voltage references and careful circuit design.

The separation or distinctness of partitions provides much of the advantage for differential signaling for high-speed signals, i.e. it is easy to differentiate between the two partitions of a differential pair by whether (Q>~Q) or (~Q>Q).

When additional levels are included to encode more bits per symbol, however, the decoding must now distinguish between different magnitudes of the difference between Q and ~Q. To encode two bits, two levels and two partitions are used. To encode three bits, four levels and two partitions are used. Very quickly the maximum difference or delta Q−~Q becomes very small from one level encoding to an adjacent level encoding.

Figure 15:
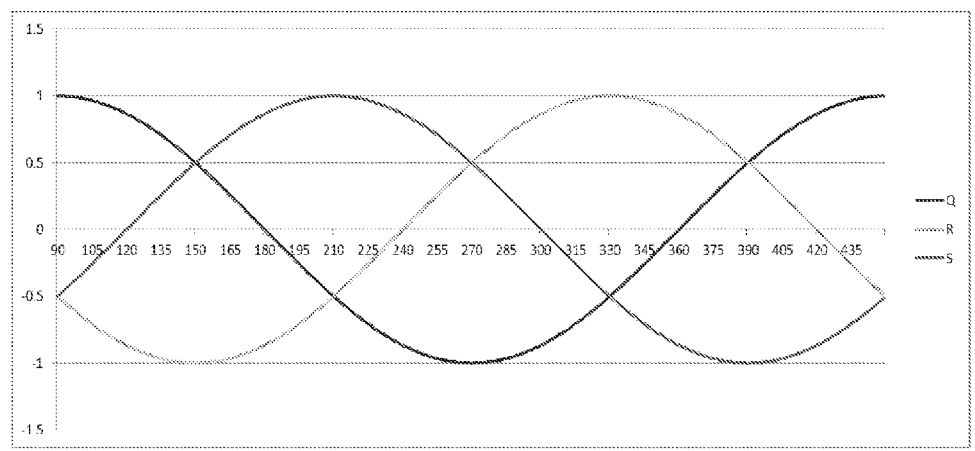
FIG. 15 illustrates representative voltages/currents on three conductors within a signaling cluster for use in encoding/decoding using relative magnitudes of the signals for digital signaling or storage according to various embodiments of the present disclosure.

Adding complexity (i.e. a third wire) according to various embodiments of the present disclosure actually introduces new "partitions" to the system. The graph of FIG. 15 shows the three wires Q, R, and S, with all of the possible combinations of voltage/current using the triphase (120-degree phasing) encoding method as previously described. As illustrated in FIG. 15, when the signal magnitude on one wire is moving in a first direction, the signal magnitudes on the other two wires of the signaling cluster are moving in different directions and/or at different rates.

Figure 16:
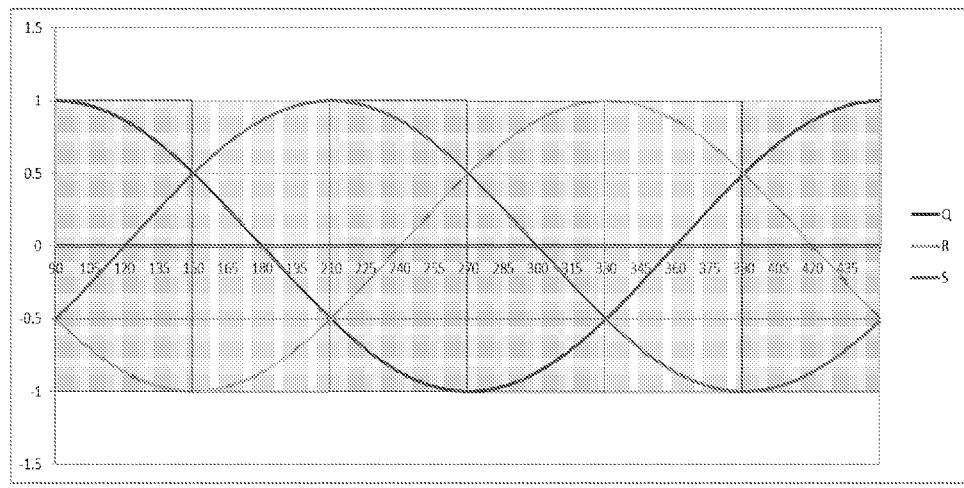
FIG. 16 illustrates representative voltages/currents on three conductors similar to those of FIG. 15 with six encoding/decoding regions or relationships among the relative magnitudes of the signals on the conductors for use in digital signaling or storage according to various embodiments of the present disclosure.

The graph of FIG. 16 is the same as the graph of FIG. 15 with shaded regions illustrating partitioning of the 360-degree encoding space into six different partitions that are easily decoded according to embodiments of the present disclosure. These partitions are the various permutations for A>B>C where A, B, and C are selected from the Q, R, and S voltages. This provides six simple-to-decode permutations and partitions.

These six partitions provide two and a half bits without any examination of absolute voltage/current magnitudes or levels. Instead, the relationships between the relative magnitudes may be used to encode/decode additional bits, rather than comparing each signal to a precision voltage/current reference to determine which symbol is represented. Moving from left-to-right across the representative embodiment illustrated in the graph of FIG. 16, partitions spanning 60 degrees have associated encode/decode criteria as follows:

1) 90 to 150 (Q>S>R)
2) 150 to 210 (S>Q>R)
3) 210 to 270 (S>R>Q)
4) 270 to 330 (R>S>Q)
5) 330 to 390 (R>Q>S)
6) 390 to 450 (Q>R>S)

The signaling (or storage) strategy illustrated by the graph of FIG. 16 can be decoded with two comparators and two AND-gates per partition. Using comparators having outputs for both match and not-match (inverse) conditions based on the inputs, the entire decode can be accomplished with three comparators and a bank of twelve (12) 2-input AND-gates. This significantly reduces the number of components needed for decoding relative to the previously described embodiments.

With substantially the same peak-to-peak voltages across the wires, the three-wire system facilitates relatively simple encoding/decoding of 2.5 bits per partition as compared to prior art differential pair implementations that encode only a single bit per partition.

Figure 17:
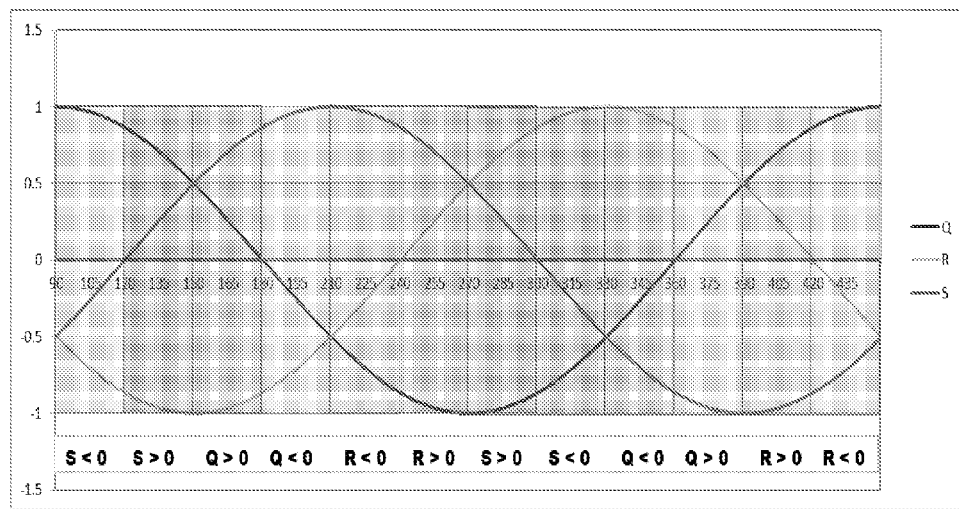
FIG. 17 illustrates twelve partitions for use in encoding/decoding bits for digital signaling or storage based on relative magnitudes and a zero crossing of voltage/current signals within a signaling cluster according to various embodiments of the present disclosure.

In the representative embodiment illustrated by the graph of FIG. 17, the six partitions illustrated in the graph of FIG. 16 are each subdivided based on zero-crossings of the signals, i.e. within each of the six partitions of FIG. 16, there is a signal which crosses zero at the middle of the partition. Adding the zero-crossing criteria to the criteria above for FIG. 16 provides the partitions illustrated in the graph of FIG. 17. As such, twelve (12) partitions based on QRS permutations and whether Q, R, or S is above or below zero within a given partition again facilitate decoding using fewer components and better noise immunity than a decoding system based on discrete signal levels. In terms of hardware, embodiments represented by the graph of FIG. 17 may be implemented by adding another comparator for above/below zero for each wire and another input to the AND-gates resulting in six (6) comparators and twelve (12) 3-input AND-gates.

Use of twelve (12) partitions facilitates decoding of 3.5 bits per partition without any need for precision voltage/current references. If only 3 bits-per-symbol are required, the extra states can be used for out-of-band signaling or for more complex encoding such as trellis-modulation, for example.

Figure 18:
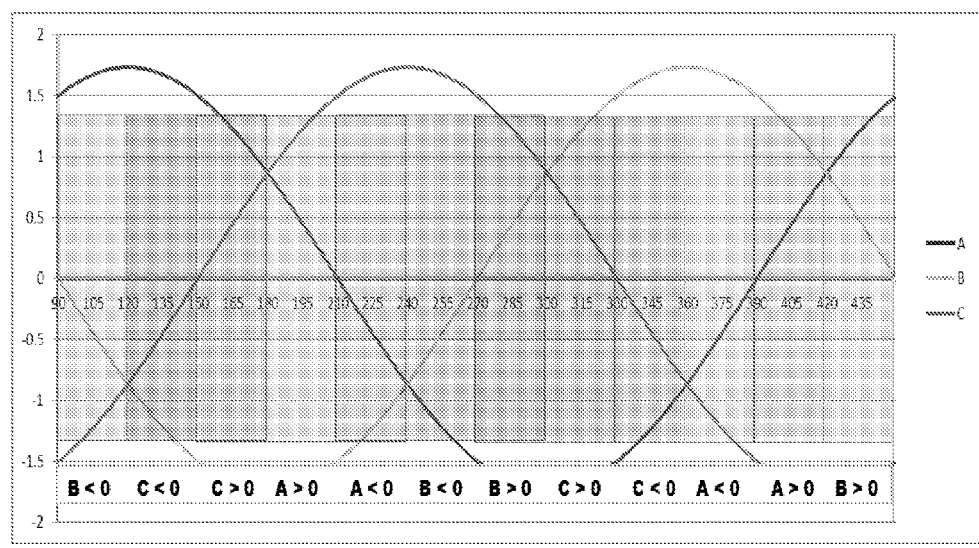
FIG. 18 illustrates encoding/decoding with twelve partitions based on relative magnitudes and difference or deltas among signals of the cluster for use in digital signaling or storage according to various embodiments of the present disclosure.

The partitions illustrated in FIG. 17 based on the relative magnitudes of the signals and a whether a particular signal is greater than or less than zero (or its average value) may also be decoded based on deltas or differences between the signals of a cluster as generally illustrated in the graph of FIG. 18 where A, B, and C represent delta values computed from Q, R, and S with:

$$A=Q-R;\ B=R-S;\ \text{and}\ C=S-Q.$$

Again, within each of the six major partitions illustrated in FIG. 16, a single delta value will be either above or below zero and may be used to easily decode the symbol. Each of the twelve (12) partitions shown in the graph of FIG. 18 has an associated encoding/decoding criteria as follows:

a) 90 to 120 (A>B>C and B<0)
b) 120 to 150 (A>C>B and C<0)
c) 150 to 180 (A>C>B and C>0)
d) 180 to 210 (C>A>B and A>0)
e) 210 to 240 (C>A>B and A<0)
f) 240 to 270 (C>B>A and B<0)
g) 270 to 300 (C>B>A and B>0)
h) 300 to 330 (B>C>A and C>0)
i) 330 to 360 (B>C>A and C<0)
j) 360 to 390 (B>A>C and A<0)
k) 390 to 420 (B>A>C and A>0)
l) 420 to 450 (A>B>C and C>0)

The above signaling or storage strategy may be implemented by a decoder having six comparators and a bank of 3-input AND-gates.

For applications or implementations that have more bits-per-symbol, a PAM-style encoding strategy that keys off of the maximum magnitude across all of the deltas may be used. Note that in the graph of FIG. 18, there is always one delta with a magnitude>=1.5V in a 1V peak-to-peak encoding system. This permits detection of levels by capturing the peak absolute magnitude and comparing it to a set of thresholds. Use of four levels combined with the above partitioning achieves 5.5 bits-per-symbol. Four comparators may be used to detect the level of the peak delta based on absolute value, or eight if detection is not based on the absolute value of the peak magnitude. This combines with the six comparators required to detect the above partitions for a total of either 10 or 14 comparators (based on whether absolute value of the peak delta is used) to decode 5.5 bits-per-symbol. The alternative embodiments described above required 12 or more comparators per delta, for a minimum of 36 comparators. As such, this approach yields more bits with significantly fewer comparators and correspondingly reduced layout area.

With six levels per partition there are 72 possible symbols for 6+ bits-per-symbol while maintaining a minimum noise margin of about ⅓ volt symbol-to-symbol.

Using 16 levels per partition, similar to the 4-bit-per-symbol differential pair described above, requires only the same degree of accuracy as the differential pair, but also provides 3.5 bits per partition for a total of 7.5 bits per symbol.

As illustrated by the various embodiments described above, use of three wires nearly doubles the signaling/storage capacity, with only 50% more wiring. This becomes significant when swapping differential-pair busses for triplet QRS-based busses. When a bus contains enough triplets to allow mapping three triplets as a group, it becomes possible to encode another set of bits as the "bias" for the three wires in a given triplet. The relatively easy-to-decode 7.5 bit system described above can then provide four times 7.5 bits, for a total of 30 bits on nine wires.

In this scenario, each wire within a signaling cluster or trio has its standard QRS value plus the bias for the trio: Q+bias, R+bias, S+bias. The sum gives (Q+R+S)+(3*bias), or simply (3*bias) because the values of QRS may be selected to sum to substantially zero. The bias automatically drops out of the delta calculations: (Q+bias)−(R+bias), Q−R, and so forth, so a given trio can be decoded without regard to any bias present on that trio.

A group or cluster having three trios each biased with another QRS symbol would include: a Q-prime bias for one trio, an R-prime bias for the second trio, and an S-prime bias for the third trio. The three biases, Q-prime, R-prime, and S-prime sum to zero exactly as any QRS trio. To decode the bias-QRS, each trio is summed together, giving a value of (3*bias). The three trios then yield three unique sums, corresponding to a QRS trio scaled by a factor of three. This is also trivial to decode with the exact same circuitry used for decoding an individual trio.

With three sets of three wires, each triplet encodes a QRS (constellation) symbol. Across groups of three trios another QRS symbol can be encoded.

The biasing strategy described above scales as bus size increases. For example, A bus of 9 wires would encode three QRS symbols plus a fourth QRS symbol across the three trios, giving four symbols for 9 wires. Similarly, a bus of 27 wires would encode four symbols for each 9 wire group (twelve symbols) plus another QRS symbol comprised of biases for each group of 9 wires giving 13 symbols per unit of time. In a simple-to-decode four-PAM-level 7.5 bit-per-symbol QRS system, a 27-wire bus could carry 13 QRS symbols at a time, for 97.5 bits across the bus per unit of time.

To provide a similar symbol rate using simple differential signaling would require 98 differential pairs (196 wires) for the ubiquitous single-bit-per-symbol systems, and 49 differential pairs (98 wires) for a SPAM-encoded system such as used in Gigabit Ethernet. With only slightly more rigor, achieving an 8-bit-per-symbol system, the 9-wire three-trio system according to one embodiment of the present disclosure sends a full 32 bits per unit time compared to the 64 wires required for the widely-used XAUI lanes used in high-speed FPGAs for handling of 10 gigabit-per-second data streams.

Because embodiments according to the present disclosure may use the same peak-to-peak voltages/currents as existing differential pairs, and the symbol rate is the same as existing differential signaling systems, the amount of energy required to transfer a given number of bits is significantly reduced using the present system as compared to prior art differential pair signaling strategies.

A representative implementation of a QRS coding strategy according to embodiments of the present disclosure adds bias to a conventional differential pair signaling strategy to increase the bit-rate. Various alternatives may be used, with a relatively simple add-on for slower speeds where radiated emissions are not an issue, which may be used as a side channel to communicate supplemental data, for example. However, application of the QRS coding strategy with bias provides more significant advantages and benefits in high-speed differential pair signaling systems, such as the widely used XAUI interface, for example.

XAUI has 8 differential pairs, each using 8b/10b encoding to transfer 8 bits of data encoded into 10 symbols as previously described. It is clocked at a speed that provides 1.25 gigabit-per-second for the encoded data. The 8b/10b encoding is used to maintain DC balance over the capacitively-coupled interface. There are a variety of ways this can be improved upon using the QRS "hierarchical coding" techniques described herein, all of which leave the core XAUI interface functioning with little modifications. A secondary circuit may be added to provide DC biasing of a given differential pair to encode more data on a single pair, across pairs-of-pairs, or trios-of-pairs, etc.

In one embodiment, a DC bias 'X' is injected so a given differential pair is no longer +/−V, but (X+V)/(X−V), i.e. both wires bias to X, and then +/−V is injected. This works fine for lower rate signaling and allows essentially 'multiplexing' the encoding on the differential pair, with the bias X selecting which set to use. Biasing of +/−X provides an additional bit, so that four bias levels provide two more bits, etc.

Another embodiment is similar to the previous embodiment in that a bias of X is applied to both wires of a given pair, but the X bias is changed at a different rate than the standard bit-rate and forms an out-of-band side-channel which allows embedding control/status information on top of the data stream as generally described above. The rate-of-change of X across different differential pairs does not need to be the same, as each pair can be treated as a different 'channel' with unique settings for X and the X-channel bit-rate.

A still further embodiment is similar to the previous two embodiments, but for each pair (group) of pairs is biased to +/−X to retain far-field cancellation. With this approach the bit-rate for X can be just as fast as the regular differential speeds. This could be described as differential-clustering, and can be hierarchical in nature like the QRS hierarchy (clusters of clusters) described herein, i.e. single pair uses +/−V, pair-of-pairs uses +/−X on top of +/−V, pair-of-pair-of-pairs uses +\−Y on top of +/−X on top of +/−V, etc. In a further modification, the coding may be QRS-based rather than differential.

The transmit circuitry could all be combined, or could use a system where the normal bitstream feeds another circuit which embeds the biasing. One implementation of the receive circuitry would include one circuit for bias-stripping that would pass through to the regular differential receive circuit.

Application of QRS Coding to Storage Mechanisms

QRS-coding according to various embodiments of the present disclosure can be also be applied to electronic digital storage mechanisms and devices, including DRAM, FLASH, and various types of magnetic and optical storage.

Dynamic RAM (DRAM) uses capacitors to store a voltage. This produces a minimal-space-per-bit storage system. The QRS-coding strategy of various embodiments described above is readily extended to DRAM systems where clusters of three capacitors are used for storage of the QRS voltages. Where existing DRAM systems use charge sensors to decode I/O in a given cell, a DRAM system incorporating the QRS coding strategies of the present disclosure would map to specific ranges of levels. If the capacitor system does not permit storing negative voltages, the full range of negative-to-positive values on the QRS system would be biased to yield all positive values, with the bias removed when the data is read back. While the charge-sense circuitry to implement a QRS coding strategy according to the present disclosure increases in complexity, the increased complexity is generally a beneficial tradeoff for the double or quadrupling of the amount of data that may be stored in a block of memory.

Existing DRAM stores a single bit per capacitor. With the 12-partition easily decodable system described herein, three capacitors would store 3.5 bits with inherent error-correction due to the constraints of QRS encoding. If a four-level storage system is used, three capacitors store 7.5 bits, more than doubling existing storage capacity.

The DRAM still requires the standard read-refresh cycles, but the decoding is performed on clusters of three capacitors rather than on a bit-by-bit basis. These "clusters" may be adjacent, or widely separated, as the clustering can be either physical or by way of a virtual mapping that ties them together. All that is required is some mechanism of allowing the various stored values to be pulled together as a set for decoding.

Physical separation of capacitors or other storage elements can enhance device resistance to phenomena such as "Single-Event Upset" (SEU) where high-energy particles can significantly modify the stored voltage or charge, particularly for small capacitors. With physically distributed "clusters" encoding QRS-style symbols and associated data, an SEU in part of a device can still allow recovery of the legitimate data from the remaining non-involved cells used for storage of the cluster.

During refresh cycles, the stored voltages are re-mapped to bits, either on-chip or remotely by the refreshing device, and then written back re-encoded to restore the original values. This allows the inherent error-correction capability of this coding system to compensate for voltage droop or increase between refresh cycles.

Integration of a QRS-encoded DRAM with I/O QRS interfaces provides the ability to store multiple bits per QRS cluster. When a QRS encoding which stores 3-bits-per-symbol is used, the effective DRAM density is equal to the currently obtainable densities. When a QRS encoding which stores 4 or more bits per symbol is used, then the effective bit density of the DRAM is increased without using any changes in technology or die shrinks.

FLASH memory uses "floating gates" to store charges. These floating gates are essentially insulated capacitors. As such, similar to DRAM, clusters of FLASH cells can be used to store QRS-encoded voltages as trapped charges on the floating gates. The wire voltage/current value is mapped to a specific charge which is then stored on a given gate within a cluster. During device reads, the stored charges are re-mapped to the wire voltage/current either through a direct coupling, or through a decode-to-bit-then-recode-to-voltage/current mechanism. As in the DRAM example, the gates of a "cluster" can be physically adjacent, or some other distribution may be provided as long as some mapping back to a single decoding set is possible.

FLASH storage devices are already using multi-level-cell (MLC) storage techniques to store 2 or three bits per cell, at a trade-off against robustness and write cycles. The trade-off occurs because the MLC storage techniques divide up the available storage voltage (e.g. 0-12 volts) into discrete sub-ranges representing each of the stored bit patterns. Because there is a much reduced voltage/charge difference between the sub-ranges, any charge migration has significantly more impact on MLC FLASH devices as compared to standard single-level-cell (SLC) FLASH devices, reducing both device longevity (duration during which reliable reads can be guaranteed) and endurance (number of write cycles before degradation occurs).

Using the QRS-coding approach according to various embodiments of the present disclosure, the same number of bits can be stored across three flash cells as are currently stored with three MLC FLASH cells, but with significantly improved longevity and endurance. If improved longevity and endurance are not an issue, then significantly more bits can be stored across the same size arrays of FLASH memory.

In magnetic storage, current designs have the ability to increase or decrease the magnetic domain stored on the disk by increasing or decreasing the current generating the magnetic field. QRS-coding according to various embodiments of the present disclosure may be used to store clusters of three magnetic domains, where the domains are generated with strengths mapping to QRS-coding of voltage/current. These clusters may be stored consecutively, on adjacent tracks, or even in widely distributed locations as long as they can be tracked together. This gives each triplet of domains self-correcting capability as well as the ability to store six or more bits in a similar area as used to store three bits using existing strategies.

In optical storage (e.g. DVD) bits are represented by variance in the reflectivity in the storage surface. Typical encoding uses presence or absence of reflection to store I/O bit values. With slight modification and higher laser frequencies permitting smaller dot generation, it becomes easy to use a larger read beam with a smaller write beam so the write beam does not create presence or absence of reflection but rather a series of amounts of reflection from none to full, allowing encoding of QRS values in triplets of storage bins in optical devices. Again, as in magnetic storage, these bins may be adjacent consecutive bins, or widely separated.

Coding Application to Optical Communications

In optical digital transmission, information is encoded by modulating either frequency or intensity of a laser. By using clusters of three states and encoding those states using QRS-coding techniques according to various embodiments of the present disclosure, it becomes possible to significantly increase the bandwidth of existing fibers by allowing more intensity, wavelength (or both) values to be encoded subject to the QRS-coding constraint of the decoded electrical values in the set sum to a known value (e.g. zero or the 'bias'). These clusters could be sequential in a single fiber, or distributed across fibers, or distributed in a more complex manner across time and/or fibers, again subject to being able to collect and decode the set.

While distribution across wires/fibers would introduce potential differences in arrival time, there are already existing techniques for synchronizing data across multiple fibers or wires to account for time delay differences from one fiber/wire to another. Those techniques would be applied to account for and synchronize clusters distributed across multiple wires or fibers.

Scalability—"Clusters of Clusters"

In various embodiments of QRS coding, the sum of the values (and the deltas as well, whether representing voltage, current, power, teslas, candela, or other potential information carrying medium) in the cluster is zero. The embodiments that use the relative magnitudes, differences, and/or zero-crossings rather than absolute values demonstrate how we to extend this concept by stipulating that rather than zero, a bias is permitted so that the QRS values instead of being symmetric about zero, are symmetric about the bias value.

With this stipulation, the sum of the values is no longer zero. Instead, simple math will show that the sum of N items within a cluster with a common bias value of B is N*B. A relatively simple summation circuit that performs a divide-by-N operation may be used so that the output of the summation circuit is B. As previously described, the deltas between each pair of signaling conductors are unaffected by any bias across a cluster.

Various embodiments according to the present disclosure may incorporate "clusters of clusters" to further increase signaling rates or bits per symbol. In these embodiments, the BIAS value for each sub-cluster may be treated as another Q, R, or S value, enabling encoding of yet another set of bits on top of the already encoded bits. All that is required is to adjust the BIAS values for each of the three sub-clusters so that the BIAS values represent the QRS-coding for another set of bits. Thus, a system using a 3-wire 5-bit encoding as previously described can be expanded to include three sets of 3-wire systems to encode 5 bits for each of the three sets plus an additional 5 bits for the cluster of three sub-clusters as described in greater detail below.

Each cluster contains signals/stored parameters representing a Q, R, and S value, which each include a bias B. With a divide-by-three summation, the Q, R, and S values sum to $3*B/3==B$. One sub-cluster is designated as the Q-sub-cluster with BiasQ, another as the R-sub-cluster with BiasR, and the third as the S-sub-cluster with BiasS. As such, another QRS sybmbol set can be encoded onto the three sub-clusters such that the summation of the biases is zero, e.g. BiasQ+BiasR+BiasS=0, such that an additional five bits are encoded in the bias values. A total of 20 bits can then be encoded on nine wires: 5 bits for each set of three wires (3*5=15) plus an additional five bits in the bias values for the single cluster of three sub-clusters. For encoding, one set of five bits determines the sub-cluster biasing, while each of the additional three sets of five bits determines the sub-cluster coding around that bias. For decoding, each sub-cluster sums to a bias, and that bias can then be subtracted out to determine the zero-based QRS coding to extract the five bits for the sub-cluster. The three biases are directly used to extract the five bits for the overall set of nine wires. Additional layers of clusters and sub-clusters may be arranged as desired for a particular application or implementation.

For applications that have three sets of nine wires, a bias may be applied for each set of nine wires, and within each set, three sub-biases may be applied exactly as done for a single layer around a fixed bias. This provides three QRS-decode layers. One layer covers all 27 wires for five bits. Another layer handles the biases for the sub-clusters within each set of nine wires, giving 3 sets of five bits. The final layer handles the individual encodings around the accumulated bias across the sub-cluster and groups of sub-clusters. This gives 20 bits per nine wires for 60 bits plus an additional five bits for the three 9-wire sets, resulting in a total of 65 bits transmitted across 27 wires. Constellations having a density higher than the 32-station constellation described in the representative embodiments above yield even more.

Incorporation into Existing Connection Technology

PCI-Express is a ubiquitous connection system. It uses a concept of "lanes" consisting of a transmit (TX) pair, a receive (RX) pair, and ground wires. The table of FIGS. 19A-C illustrates application of a coding strategy according to various embodiments of the present disclosure to a PCI Express signaling system. In the table of FIGS. 19A-19C, the standard pin assignments for PCI Express connectors are provided in the left three columns. In the right three columns, the table shows how QRS signaling could be incorporated into the PCI Express connector by simply reassigning one ground per Tx/Rx pair. Various other implementations may also be possible.

As can be seen by the embodiments illustrated and described above, systems and methods for wired signaling and digital storage according to the present disclosure may provide a number of advantages and facilitate a substantial increase in the input/output capacity or storage capacity for a number of applications including integrated circuits, such as microprocessors, without consuming significant on-chip resources or power budgets. Likewise, embodiments according to the present disclosure may provide an order of magnitude or more increase in I/O data rates over chip-to-chip busses without an increase in pin count or significant increases in power budget. As such, embodiments of the present disclosure facilitate a significant increase in chip-to-chip or component-to-component available bandwidth, with an associated significant increase of the processing capability of microprocessors and other integrated circuits. For digital storage applications, it is also possible to increase bit storage with smaller DRAM/FLASH arrays. Longer-term storage on magnetic or optical devices receives a boost in bit density without significant changes in device technology. The communication of multiple bits of information using a single symbol represented by n-dimensional coordinates facilitates a reduction in the signal edge rates and a corresponding reduction in radiated emissions. Embodiments that permit only one wire of a signaling group or cluster to change state at a time may also reduce radiated emissions. Embodiments may include a ground wire or conductor associated with each signaling cluster to reduce or eliminate coupling of signals between adjacent signaling clusters. Using signaling strategies according to the present disclosure addresses the I/O bottleneck encountered by parallel high-speed systems and provides a path forward that will limit the influence of I/O pad size from being the integrated circuit bottleneck for the foreseeable future.

For digital storage devices, such as DRAM and FLASH devices, systems and methods according to the present disclosure may be used to increase bit-density, or smaller dies may be used to achieve the same bit-count. For magnetic devices, such as magnetic disks or tapes, bit-density can be increased without significant rework of the magnetics currently used in such systems.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention. Similarly, while the best mode has been described in detail with respect to particular embodiments, those familiar with the art will recognize various alternative designs and embodiments within the scope of the following claims. While various embodiments may have been described as providing advantages or being preferred over other embodiments with respect to one or more desired characteristics, as one skilled in the art is aware, one or more characteristics may be compromised to achieve desired system attributes, which depend on the specific application and implementation. These attributes may include, but are not limited to: cost, strength, durability, life cycle cost, marketability, appearance, packaging, size, serviceability, weight, manufacturability, ease of assembly, etc. The embodiments described herein that are characterized as less desirable than other embodiments or prior art implementations with respect to one or more characteristics are not outside the scope of the disclosure and may be desirable for particular applications.

What is claimed is:

1. A method for coding information using a group of "n" components, comprising:
associating a unique multiple-bit binary pattern with corresponding unique n-dimensional coordinates for each of a plurality of patterns;
converting each coordinate of the n-dimensional coordinates to a corresponding voltage or current;
applying each voltage or current associated with the n-dimensional coordinates to a corresponding component of the group of "n" components, wherein the number "n" of components is less than the number of bits of each multiple-bit binary pattern; and
decoding the multiple-bit binary pattern associated with the n-dimensional coordinates based on detecting relative voltages or currents among the "n" components, wherein the decoding further comprises comparing voltage or current associated with a first component of the "n" components with voltage or current, respectively, of at least one other component of the "n" components, and decoding the multiple-bit binary pattern based on which of the at least one other component exceeds the voltage or current of the first component.

2. The method of claim 1 wherein the components comprise conductors.

3. The method of claim 1 wherein the components comprise capacitors of a dynamic random access memory.

4. The method of claim 1 wherein the components comprise cells of a FLASH memory.

5. The method of claim 1 wherein the ["n"] components comprise ["n"] conductors and wherein each conductor has an associated secondary conductor, the method further comprising applying an inverse voltage or current to the secondary conductor such that each conductor and its associated secondary conductor function as a differential signaling pair.

6. The method of claim 1 wherein the voltages or currents associated with each multiple-bit binary pattern sum to substantially zero.

7. The method of claim 1 further comprising:
grouping the "n" components into a plurality of groups;
applying a bias to components in each of the plurality of groups, wherein different biases are applied to different ones of the plurality of groups; and
coding information using the different biases.

8. The method of claim 1 further comprising: generating differential voltages or currents for at least two pairs of the components; and
decoding the multiple-bit binary pattern based on the differential voltages.

9. The method of claim 8 wherein decoding the multiple-bit binary pattern comprises comparing magnitudes of the differential voltages of the at least two pairs of the components.

10. A method for encoding/decoding digital data using first, second, and third components, comprising:
associating the digital data with corresponding unique two-dimensional coordinates representing amplitude and phase of a periodic waveform having an associated period;
converting the amplitude and the phase to a first corresponding voltage or current and applying the voltage or current to the first component;
converting the amplitude and the phase to a second corresponding voltage or current based on a value of the periodic waveform phase shifted by one-third of the period relative to the amplitude and the phase and applying the second corresponding voltage or current to the second component;
converting the amplitude and the phase to a third corresponding voltage or current based on a value of the periodic waveform phase shifted by two-thirds of the period relative to the amplitude and the phase and applying the third corresponding voltage or current to the third component; and decoding the unique two-dimensional coordinates by comparing magnitudes of the voltage or current associated with the first component, the second component, and the third component, wherein the decoding further comprises comparing differential voltage or current among pairs of the first, second, and third conductors relative to differential voltage or current of other pairs of the first, second, and third conductors.

11. The method of claim 10 wherein the first component, the second component, and the third component comprise capacitors of a dynamic random access memory device.

12. The method of claim 10 further comprising: applying a bias to the first component, the second component, and the third component; and encoding/decoding at least some of the unique two-dimensional coordinates using the bias in combination with the magnitudes of the voltage or current associated with the first component, the second component, and the third component.

13. The method of claim 12 further comprising:

applying a second bias to each component of a second group of components;

applying a third bias to each component of a third group of components, wherein the second and third biases are different from the first bias, and wherein at least some of the two-dimensional coordinates is encoded by the biases applied to the groups of components.

14. The method of claim 13 wherein the voltage or current applied to the first, second, and third components sums to substantially zero.

15. The method of claim 14 wherein the decoding comprises removing the biases from each of the components prior to comparing the component voltage or current to voltage or current of other components.

16. A system for storing digital data associated with amplitudes and phases of a periodic waveform having a period of 360 degrees among a plurality of components of a memory device, comprising:

circuitry that converts a first amplitude and a first phase of the periodic waveform to a first corresponding voltage or current and applies the first corresponding voltage or current to a first one of the plurality of components, and converts the first amplitude and the first phase to (n−1) corresponding voltages or currents based on amplitudes of the periodic waveform phase shifted by about m*(360/n) relative to the first phase where m is indexed from one to (n−1) and applies each corresponding voltage or current to an associated component of the plurality of components of the memory device;

circuitry that compares magnitudes of the first component and one or more of the (n−1) components to decode the digital data stored in the memory device;

circuitry that applies a bias to the voltage or the current of the plurality of components; and circuitry that encodes digital data using the bias applied to the plurality of components.

17. The system of claim 16 wherein the components comprise capacitors of a dynamic random access memory (DRAM) device.

* * * * *